(12) United States Patent
Pope et al.

(10) Patent No.: US 7,108,001 B2
(45) Date of Patent: Sep. 19, 2006

(54) METHOD AND APPARATUS FOR ROTATION OF A WORKPIECE IN SUPERCRITICAL FLUID SOLUTIONS FOR REMOVING PHOTO RESIST, RESIDUES AND PARTICLES THEREFROM

(76) Inventors: Keith Pope, 38 N. Hawthorne Blvd., #J305, Bedford, NH (US) 03110; David J Mount, 21 Deer Meadow Rd., North Andover, MA (US) 01845; Laura Rothman, 104 Geer Mountain Rd., South Kent, CT (US) 06785; Rick C White, 6 Cannongate III, Nashua, NH (US) 03063; Clifton Busby, 17 Pochelon St., Georges Mills, NH (US) 03751; Stephen B Douglas, 93 Guggins La., Boxborough, MA (US) 01719; Raymond J Doww, III, 23 Edgewood Run, Amherst, NH (US) 03031

( * ) Notice: Subject to any disclaimer, the term of this patent is extended or adjusted under 35 U.S.C. 154(b) by 0 days.

(21) Appl. No.: 10/818,548

(22) Filed: Apr. 5, 2004

(65) Prior Publication Data

US 2004/0194817 A1    Oct. 7, 2004

Related U.S. Application Data

(60) Provisional application No. 60/460,133, filed on Apr. 3, 2003.

(51) Int. Cl.
*B08B 3/04* (2006.01)
*B08B 7/04* (2006.01)

(52) U.S. Cl. .................. 134/141; 134/33; 134/37; 134/149; 134/157; 134/200; 134/902

(58) Field of Classification Search .............. 134/141, 134/147, 153, 200, 902, 33, 36, 149, 157, 134/37
See application file for complete search history.

(56) References Cited

U.S. PATENT DOCUMENTS

| 3,650,129 | A | * | 3/1972 | Scroop et al. ............... 68/23.5 |
| 4,059,959 | A | | 11/1977 | Matthews |
| 4,077,220 | A | | 3/1978 | Matthews |
| 4,118,927 | A | | 10/1978 | Kronogard |
| 4,142,108 | A | | 2/1979 | Matthews |
| 4,380,903 | A | | 4/1983 | Matthews |
| 5,669,251 | A | * | 9/1997 | Townsend et al. ........... 68/58 |
| 6,666,928 | B1 | * | 12/2003 | Worm ........................ 134/33 |
| 6,736,906 | B1 | | 5/2004 | Cotte et al. |
| 6,821,356 | B1 | * | 11/2004 | Wandke et al. ............. 134/33 |

\* cited by examiner

FOREIGN PATENT DOCUMENTS

DE    19922195 A1 * 11/2000

*Primary Examiner*—Alexander Markoff
(74) *Attorney, Agent, or Firm*—Maine & Asmus

(57) ABSTRACT

A supercritical fluid cleaning system uses process fluid for operating rotary motors in the chamber with fluid bearings and fluid load levitation for rotating workpieces and impellers. Rotating speed and direction sensors and a home position locator facilitate motor control. Impellers add further agitation of the fluid in the chamber, faster processing, and greater uniformity of supercritical fluid components and increase mass transfer of fluid to the processed surface. Centrifugal operated clips and cassettes hold wafers and impellers. Non-contact, fluid operated rotating mechanisms reduce contamination. Physical, rotational, and shear affects are enhanced through centrifugal forces which can induce the separation of films localized deposits or molecular products of the reaction from the surface. There is a concomitant agitation of fluid, and continuous angular acceleration imparted to the processed surface features.

17 Claims, 19 Drawing Sheets

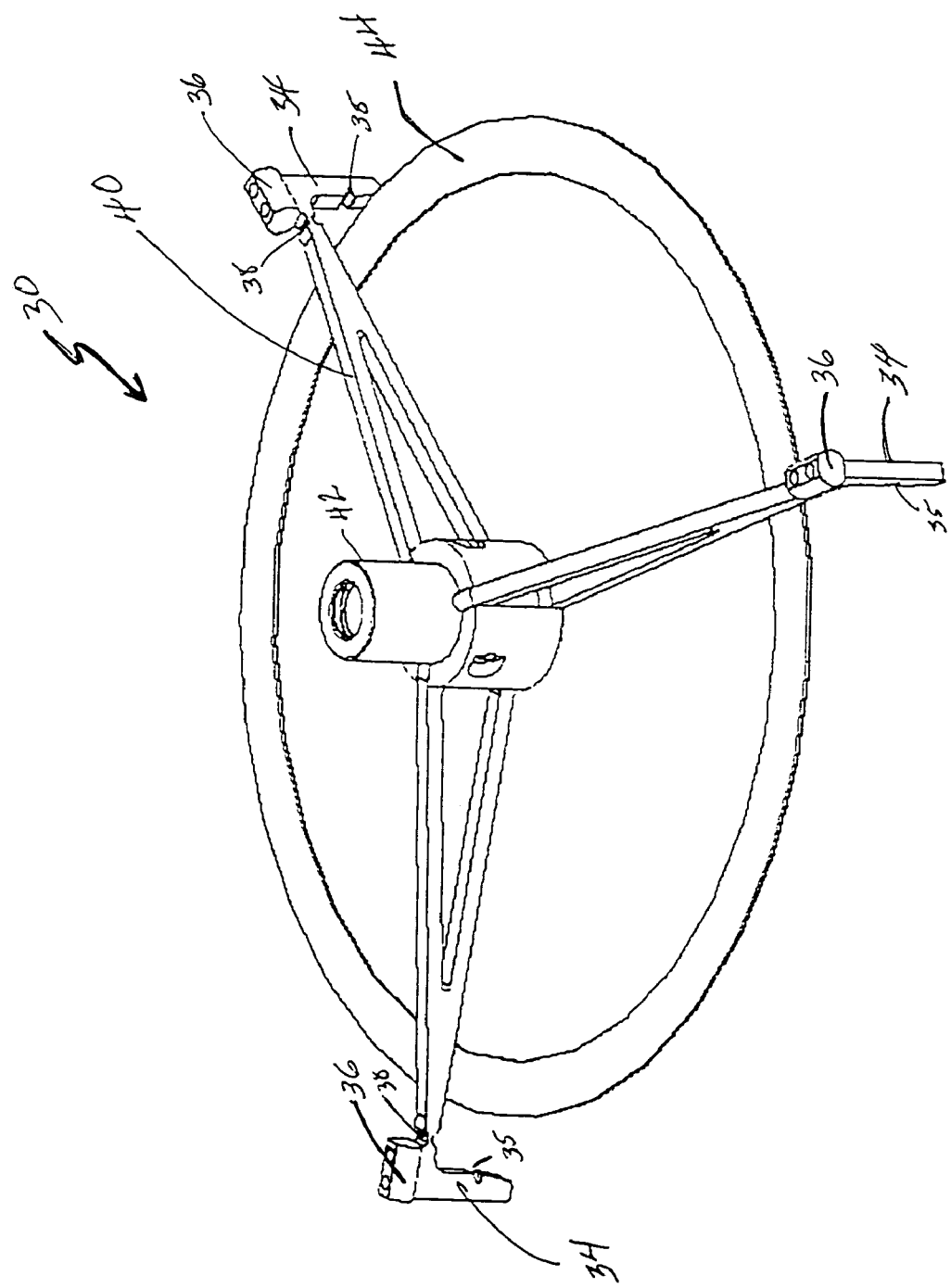

Fig. 17A
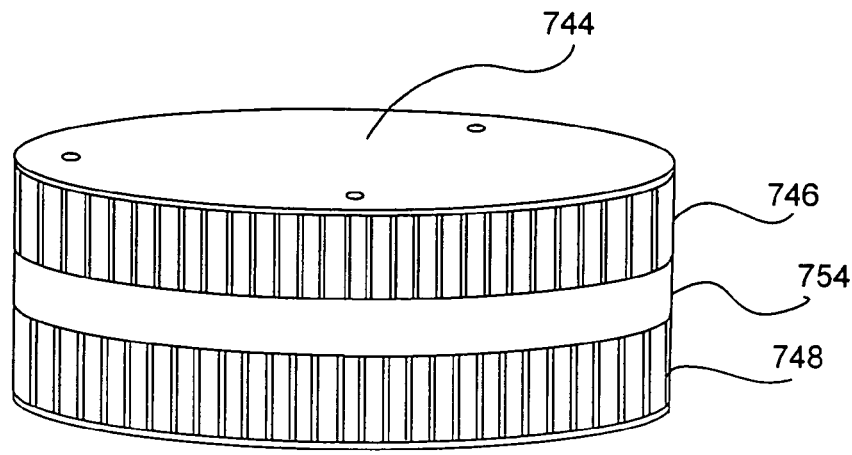
Fig. 17B
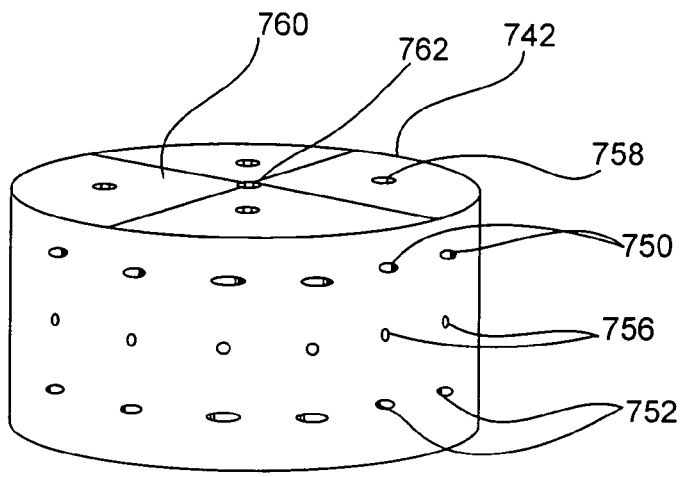
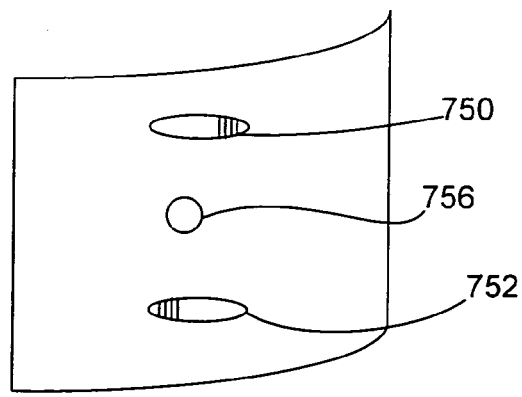
Fig. 17C

METHOD AND APPARATUS FOR ROTATION OF A WORKPIECE IN SUPERCRITICAL FLUID SOLUTIONS FOR REMOVING PHOTO RESIST, RESIDUES AND PARTICLES THEREFROM

This application relates and claims priority to pending U.S. Application 60/460,133 filed Apr. 3, 2003.

FIELD OF INVENTION

This invention relates to high temperature, high pressure processing of semiconductor and other substrates and articles with the addition of fluid driven substrate rotation and chamber fluid agitation in the processing environment; and more particularly to adding fluid supported and fluid driven substrate rotation and fluid agitation by use of an alternate source of process fluid supplied at higher than process pressure, to add further effect to the processing conducted within a supercritical fluid processing environment.

BACKGROUND OF INVENTION

The fluid-based processing of a surface film is a general system finding application in a wide range of industrial processes, including: plating and surface finishing, electrochemical transformations, deposition and polishing of materials, semiconductor device fabrication, cleaning and stripping, doping, anodizing, passivating, and so on. The number and diversity of such processes makes an exhaustive listing impractical. The factors that significantly effect the rate of such processes depend on the nature of the workpiece, the nature of the desired process, and the chemical or physical process chosen to effect such processes.

The prior art of supercritical fluid cleaning methods and systems for removing photo resist from semiconductor substrates and related requirements involves injecting fluid and additives to the cleaning chamber, and elevating the temperature and pressure to supercritical levels, where a combination of chemical and mechanical mechanisms perform the necessary work to loosen and remove the unwanted materials. The cleaning fluid mixture may be elevated in temperature and pressure to supercritical state prior to injection into the chamber, or the chamber may have internal heating elements to heat the fluid from liquid under pressure to supercritical state. Directional control of the through-flow of fluid through the chamber, as by nozzles or other flow directing devices, has provided the principle mechanical mechanism or component of the method of cleaning, directing the flow at or towards the surface at a desired angle.

An example of one known supercritical fluid cleaning process is the cleaning of a contaminating film from a silicon wafer serves to illustrate how the invention offers distinct advantages. This process typically uses a fluid to loosen, dissolve or otherwise chemically or physically transform the contaminating film on the wafer, the transformation facilitating the removal of said film. This process can conceptually be divided into several simultaneously occurring sub-processes, i.e. transport of the fluid onto or into the film, chemical or physical transformation of the film, and removal of the transformed layer to the fluid, rendering the cleaned surface. Each of these processes may be comprised of several physical or chemical elementary steps.

A well-known principle in kinetics states that the overall rate at which the process occurs is limited by the slowest sub-process or elementary step. In some cases, the slowest step may be the rate of transport of material to and from the surface of the workpiece. In such cases, the advantage of rotationally induced increased mass transport is evident. In other cases, the slowest process may be the physical removal of solvated or swelled polymer film from the surface of the workpiece, and the simple shear induced by angular acceleration acts to increase the overall process rate. In still other cases, the overall rate of the process is acceptable, but there is a question of uniformity between contiguous areas of processed surface, perhaps caused by non-uniform flow patterns inside the chamber. The time-averaging of the composition of fluid exposed to an element of surface would act to minimize undesirable effects of non-uniform chemical environment. Thus, the simple rotation of the substrate in the flowing fluid offers a combination of potentially important advantages.

A mathematical treatment of the flow characteristics of a rotating disk relate the basic advantages of the rotating workpiece design which are a consequence of the solutions of the corresponding convective diffusion equation. The details of the analysis can be found in standard textbooks—see, for example, Rotating Disk Electrode, found in Electrochemical Methods, section 8.3, page 283, by Allen J. Bard and Larry R. Faulkner, copyright 1980 John Wiley & Sons, Inc. Though not previously extended to supercritical fluid cleaning processes, this mathematical model is readily extended to describe such systems where the workpiece being cleaned is subjected to rotational movement.

According to this model, a combination of the normal and radial fluid velocities result in the acceleration of fluid in a direction normal to the surface of and toward the center of the disk, and simultaneously, a parabolic velocity profile for the fluid moving tangentially to the surface of the workpiece and outward from the center toward the edge. Thus, as fluid elements near the surface are accelerated toward the edge, a flow of fluid from the bulk solution is drawn toward the center of the disk to replace them. The relative magnitudes of all of these flow components depend upon the viscosity of the fluid, the angular velocity of the disk, and the point on the phase diagram for the fluid that corresponds to the processing conditions. The result of these actions is a combination of mass transfer to the disk and simultaneous radial shear of the film or structure at the surface, which, in the case of the removal of Photoresist, is highly advantageous.

The addition of mechanical agitation to the supercritical fluid further enhances such processes, as was discussed in this Applicant's U.S. patent application Ser. No. 10/755,432, filed Jan. 12, 2004, which is hereby incorporated by reference. The simultaneous agitation and directed mass flow of processing supercritical fluid toward a workpiece, including the associated cosolvent and dissolved chemical components, is achieved through the use of a mechanical system to rotate the workpiece during the processing. This action of rotation creates the necessary stirring of the process fluid and serves to both increase the rate of delivery of reactants to the surface of the workpiece, removal of products, and, in the case of cleaning or stripping, application of simple radial shear at the interface between the film and the surface, which increases the rate of stripping of Photoresist. These additional actions serve to enhance the overall processing, and are supplied in addition to the other advantages present in a supercritical fluid processing system, thus increasing the speed and effectiveness of such an operation. Fluid agitation, alone, however, is limited in effectiveness due to viscosity effects near the surface of the workpiece.

Even for a fluid near its critical point, the tangential component of fluid motion relative to the workpiece surface reaches a limiting value that is insufficient to efficiently remove particles of radius, or films of thickness, less than 100 nm. This is problematic since there is a well-recognized need to be able to remove material from a surface down to at least 30 nm. Rotation of the workpiece circumvents this limitation because there is no viscosity dependent upper bound on the magnitude of the centrifugal force that may be generated during a process with rotation, and is only limited by robustness of the mechanical design of the rotation mechanism itself and the compliance of the workpiece.

The rotational processing scheme also provides a unique advantage over other schemes in the application of thin film stripping. The removal of thin films, continuous or discontinuous, is a needed capability in virtually all multilayer microelectronic fabrication processes, especially related to the removal of Photoresist. As is the case with particle removal, the ever-diminishing local scale of fabricated structures is concomitant with increasing demands on processibility, with similar limitations by physical laws. In The case of thin films, however, rotation induces a mechanical strain field in the plane of the film, and this further induces incipient weaknesses in the film due to the differential acceleration of contiguous regions of the film. These actions cause stress to accumulate, and eventually lead to accelerated penetration of the film by the processing fluid and a notably enhanced rate of removal—a phenomenon similar to that commonly known as "stress cracking." Organic polymer-based Photoresist films are especially susceptible to this mechanism of degradation, which leads to irreversible removal of even highly insoluble material.

Providing rotational capability to a wafer holder in a pressure vessel at 10,000 psi, at 150 degrees Centigrade, filled with supercritical fluid, is problematic. A conventional electric motor is unusable in this environment for many reasons including materials incompatibility, electrically conductive windings, and contamination from lubricated bearings, cooling requirements, size, electrical leads, and so forth. In addition, the fluoropolymer-based materials that might be employed to alleviate such difficulties also tend to be soluble in carbon dioxide and thus tend to create more problems than they solve. There are sealed motors, so called "can" motors that are sealed. However, cooling requirements, electrical leads, and shaft bearings and seals remain obstacles to their practical use in this application.

An external motor coupled by a rotating shaft penetrating the pressure chamber resolves some issues, but use of contact bearings on the through wall shaft and chamber-internal rotational components poses the same contamination issues, and the high working pressures make shaft seals problematic.

Magnetically coupling of an external motor to an internal shaft and rotable wafer holder has been disclosed, but again, contact bearings within a process vessel are inevitably a contamination problem to some extent.

SUMMARY OF THE INVENTION

It is an object of the invention to provide rotary mechanisms for use within a high pressure, high temperature processing environment, for purposes including wafer, substrate, or workpiece rotation, and for providing energy for agitation as in rotary agitation of the fluid with an impeller which may be in close proximity to the face of a wafer in process.

It is a further object to provide for fluidic centering for and fluidic load support by such rotary mechanisms.

It is a still further object to provide for an all-fluid powered rotary mechanism providing fluid pressure and flow for load lifting, fluid pressure and flow for load centering, fluid isolation of the load platform and load from other mechanical contact, and fluid pressure and flow for torque for rotation.

It is another object to provide means for securing wafers, substrates, workpieces and/or impellors individually or in combination to such fluid operated rotary mechanisms.

While air bearings are well known and commonly employed in other fields for low friction shaft centering within a bearing race, no one, to this Applicant's knowledge, has attempted to apply air bearing technology to high pressure, high temperature fluid processing as it is practiced in the semiconductor industry or to other supercritical fluid processes. A vertically oriented air bearing, air table type of device offers the unique and attractive properties of non-contact levitation of the load bearing platform off a base component, and non-contact centering of a vertical bearing journal shaft upon which the platform can be mounted, with near-frictionless rotation capability of the bearing journal shaft and platform component. Upon research and reflection, the relatively high density, low viscosity characteristic of a supercritical fluid is attractive as an operating gas for these air bearing functions. Using a dense phase or supercritical phase fluid rather than air or gas to operate such a bearing, and operating it in a high temperature, high pressure process fluid environment, are important aspects of the invention. An air bearing type device successfully applied to this application might be more properly referred to as a fluid bearing.

A further aspect of the invention is to further alter such a device to hold its base or race component stationary, connect the load platform to its fluid centered journal shaft, and to then configure and enable the shaft and load platform to be driven in rotation by fluid pressure and flow. The ramifications of these modifications makes the device much more than a bearing. As will be instantly apparent to those skilled in the art from these specified modifications, the resulting device can be more aptly described as a fluid centered, fluid supported, fluid isolated, fluid driven, rotary power source, or otherwise stated, a fluid operated rotary motor with a fluid-isolated output shaft or load platform. With the working surface or load platform of the rotary device loaded or otherwise coupled to a load, the bearing journal shaft being fluidly centered and the load platform being fluidly borne, a turbine-like configuration of fan blades on the journal shaft may be driven by one or more jets of the same fluid to apply torque to the load. Other variations for implementing the rotation with fluid pressure and flow are within the scope of the invention, including two sets of jets and blades for applying torque in either direction. Further considerations are necessary, however, before the device can be expected to operate usefully in a supercritical processing station which is subject to widely ranging temperatures and pressures.

A fluid operated rotary device appropriate to the invention may have features that make the device compatible with other materials used in a wafer processing system. Organic polymer-based or highly porous refractory material-based parts are incompatible with this environment because they are easily swelled by, penetrated by, and retained for later deleterious release. High nickel alloy steel or high modulus ceramic materials are best used for its construction, according to various embodiments, to withstand the chemical environment which routinely presents active fluoride and other corrosive agents to all fluid contacted surfaces. Highly adjustable, independently controllable levitation and rotation functions operable in high temperature, high pressure processing fluid environment are critical enabling features of the invention.

Separately controllable fluid supply sources are required to operate the fluid operated rotary device. The fluid flow control circuits for operating the bearings may have or maintain bearing fluid pressure at a consistently higher pressure than the nominal or ambient in-vessel process pressure, which of course is variable from outside ambient or normal atmospheric pressure up to the maximum working pressure of the vessel. There must also be an adequate flow capacity of process fluid to the device to assure proper operation, and the pressure chamber may need a correspondingly calibrated leak or volumetric outflow in order to maintain the desired nominal chamber pressure. Some degree or portion of the pressurization cycle for bringing the chamber up to the desired maximum pressure can be accomplished by the admission of fluid into the chamber by concurrent operation of the rotary device of the invention, so long as a suitable pressure differential is maintained between the rotary device fluid source pressure and the increasing chamber pressure.

Consideration of the mass of the rotating components of the rotary device, both loaded and unloaded, should be taken into account, in conjunction with the higher specific gravity of a supercritical fluid, as well as the necessary pressure differential and flow capacity required for rotational acceleration and speed control. The rotary device geometry and control fluid circuitry may provide for accelerating, maintaining the desired full speed, and decelerating the rotating component, in addition to centering and lifting the working platform. A homing mechanism may be used to assure the correct orientation of the bearing's rotating component or workpiece holder when stopped for loading and unloading of wafers.

In order not to produce contaminating and destructive particulate resulting from the initial relative movement of the rotating component on the base, fluid levitation and fluid centering of the rotating component and load platform may be established before rotation is initiated, and continue until rotation is ceased. Other and additional schemes for the avoidance of particulate formation in the movement of the fluid operated rotary device may also include the exertion of a degree of initial magnetic levitation, however this method is generally hard to precisely control due to the high force gradient normally encountered at the edges of magnetic fields.

Rotary devices of the invention can be vertically stacked within a process chamber. A useful inverted or downward facing load platform or mounting surface can be configured on the bottom end of a journal bearing and operated in the upper region of a pressure chamber in proximity to a normally oriented rotary device located in the lower region of the pressure chamber. However, the use of magnetic or electromagnetic force offers a useful alternative configuration for operating a rotary device of the invention inverted. This can be done by incorporating magnetic forces of attraction between the base and its rotary component to overcome gravitational forces to yield a net upward force on the rotating component, holding it against its base component. Applying the fluidic lifting force to overcome the magnetic force results in pushing or floating the rotating component downward from the base. This inverted orientation and operation offers, in particular, the benefit of placing two such rotary devices in a face to face or platform to platform orientation, where a concurrently applied lifting motion brings the two platforms in closer proximity to each other than otherwise.

A process fluid source and subsystem controlled to always be at a pressure higher than ambient chamber pressure when any of centering, lift and rotation is required, is necessary to these preferred embodiments and is integratable into the overall pressure vessel and process fluid circuit and control system.

Fluid operated, turbine powered rotary devices and embodiments are described below for supporting topside or underside mounted wafers and workpieces or impellors. Further embodiments provide for securing single wafers or impellers with clips, or multiple wafers or wafer/impeller combinations in a stacked assembly to either an upper or underside fluid bearing mechanism. A single wafer or wafer stack may be capped by an impellor that is loaded from an external source after the wafers are loaded, so that the wafers and impellor are rotated by rotation of the fluid bearing. Upper and lower fluid bearing mechanisms may carry an array of wafers and impellers when fully loaded. Upper and lower fluid bearing mechanisms may be functionally coupled or connected by their respective loads of wafers and/or impellor. Bi-directional operation of the fluid mechanisms may be used to effectively reverse the effects of the impellor on the nearby wafer surfaces.

Substrate or wafer-holding clips and related mechanisms are provided for gripping the substrate by its edges so that one or both sides are exposed for cleaning or other processing. Wafers may be loaded with either side of the substrate as the "up" side in the cleaning chamber, providing further process elements and enhancements contributing to the overall effectiveness of the process. Processing a wafer upside down, for example, introduces the force of gravity as a further aid to the removal of loosened particles.

Various clip and other wafer retention mechanisms are disclosed. Centrifugal forces occurring during rotation may effectively close, lock, latch or further secure the workpiece to or within the holder in some embodiments. The separate source of process fluid used to operate the rotary device may also be used for auxiliary uses such as providing vertical motion capability to or within the rotary device for use during loading and unloading operations, and for operating some types of wafer retention clips and devices.

Other and various objects and advantages of the invention will be apparent to those skilled in the art from the figures and description provided.

BRIEF DESCRIPTION OF THE FIGURES

FIG. 6 is a top perspective view of a wafer rotation and retention structure having centrifugal force actuated counter balances.

FIG. 14B illustrates the clips in a closed position as would be abutting the edge of a workpiece; FIG. 14C illustrates both the open and closed position of the clip.

FIGS. 17A and B are perspective views of the rotating load platform component and fixed base components of a fluid operated rotary device embodiment having external turbine blades, the lifting ports being visible on the top surface of the base component.

FIG. 17C is a close up perspective section of the sidewall of the base component of FIG. 17B, illustrating the turbine jets and centering ports by which the rotating component of FIG. 17A is operated.

DETAILED DESCRIPTION

The invention is susceptible of many embodiments, one embodiment of the present invention provides for the introduction of fluid driven rotary power mechanisms within a high pressure, high temperature, critically clean, wafer processing chamber, without the use of contact bearings. The rotary units may provide for either or both of single or multiple wafer or impellor support and rotation, for enhancing the process within the chamber.

Referring to the figures generally, to generate this additional processing force within the chamber, a rotary agitation and/or substrate gripping and rotating system is added to the process chamber. Various embodiments utilize a fluid centered, fluid supported, fluid isolated, fluid driven rotary mechanism. In all cases, the rotary mechanisms provide for the delivery of substantial kinetic energy into the chamber intended to affect the substrate and/or the fluid/substrate interface.

Figure 1:
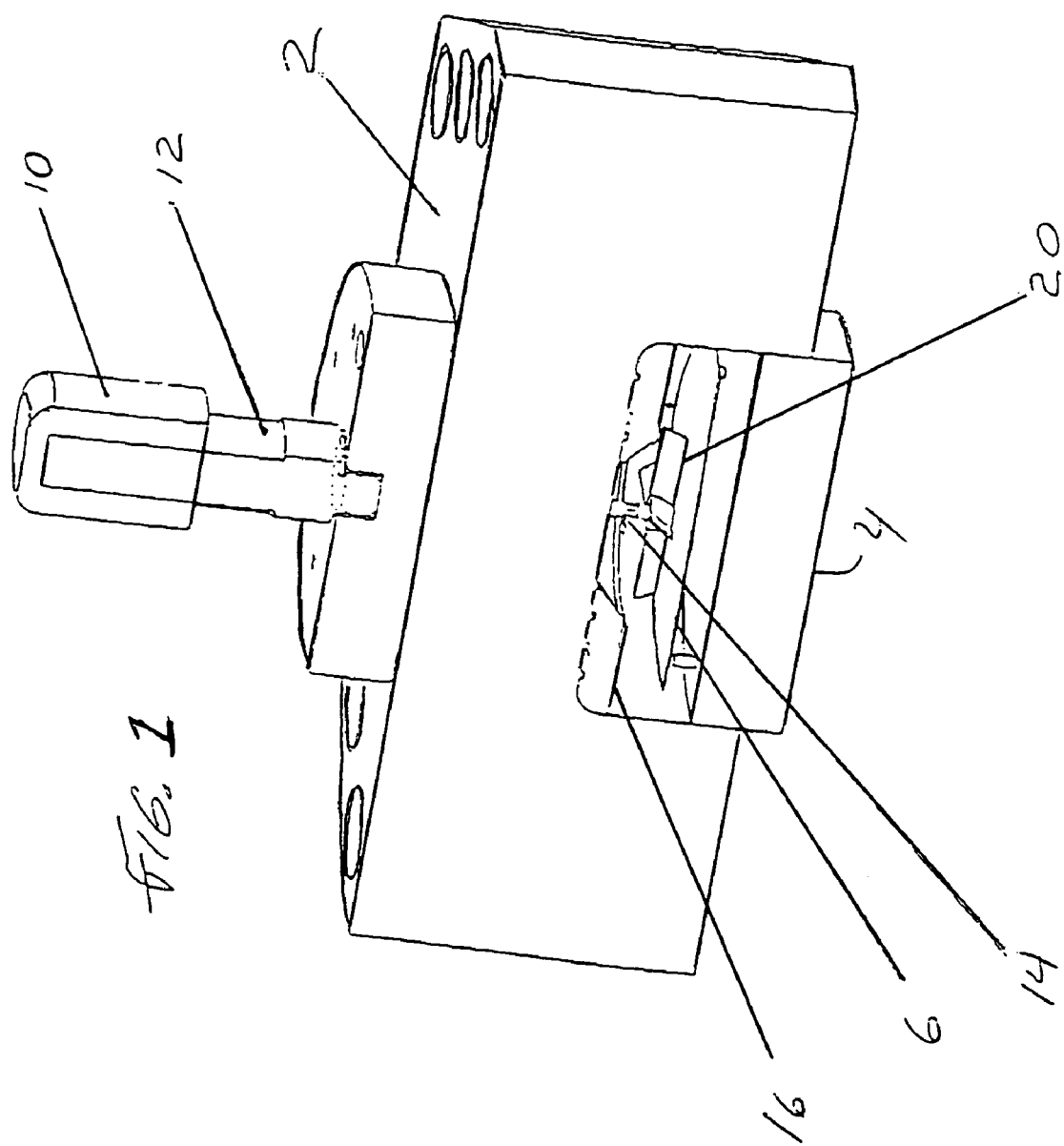
FIG. 1 is a perspective cross section view of a first embodiment of the invention, disclosing an external motor magnetically coupled to a shaft to an impellor within the cleaning chamber which by rotation creates turbulence in the supercritical phase processing mixture in proximity to the substrate surface being cleaned.

Referring to FIG. 1, there is illustrated an agitator or impellor configured according to one embodiment of the present invention and which comprises of an externally mounted AC drive motor 10, connected to magnetic impellor coupler 12, and drive shaft 14, to which impeller 20 is attached; and baffles 16 which are affixed to the interior of the pressure vessel cleaning chamber in about the same plane and just outboard of the impeller. The impeller is positioned close to the surface of substrate 6, being cleaned.

In the wafer, workpiece, or substrate 6 gripping and rotatory embodiment, the impeller 20 is replaced instead by a support mechanism for the substrate, providing a rotating workpiece 6. It is understood by this that there would be no impeller, and the workpiece would be mounted to the rotating assembly instead of the impeller. It is further understood that the chamber may incorporate both a rotating workpiece mechanism and a mechanical agitator mechanism, as by having one configured axially from above and the other configured axially from below, with the prime side of the substrate or workpiece directed towards the agitator.

Figure 8:
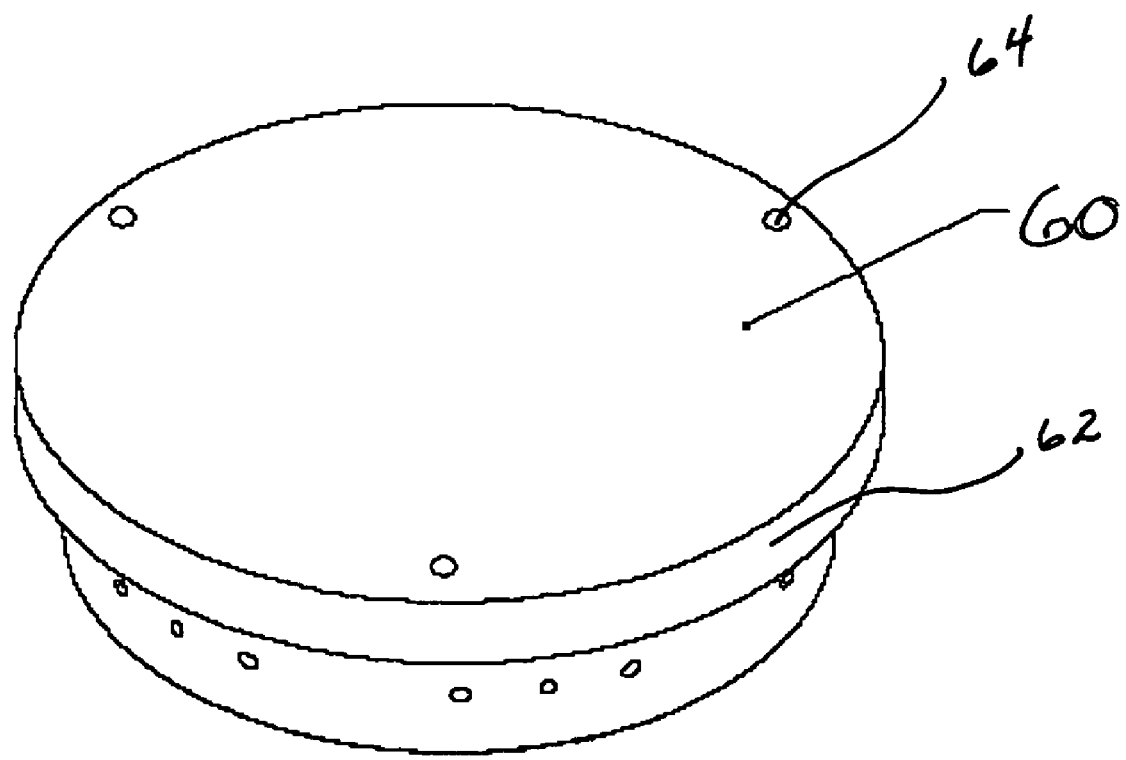
FIG. 8 is an assembly perspective view of a fluid operated rotary power source of the invention, with the wafer support surface and mounting locations for wafer retention clips exposed.
Figure 9:
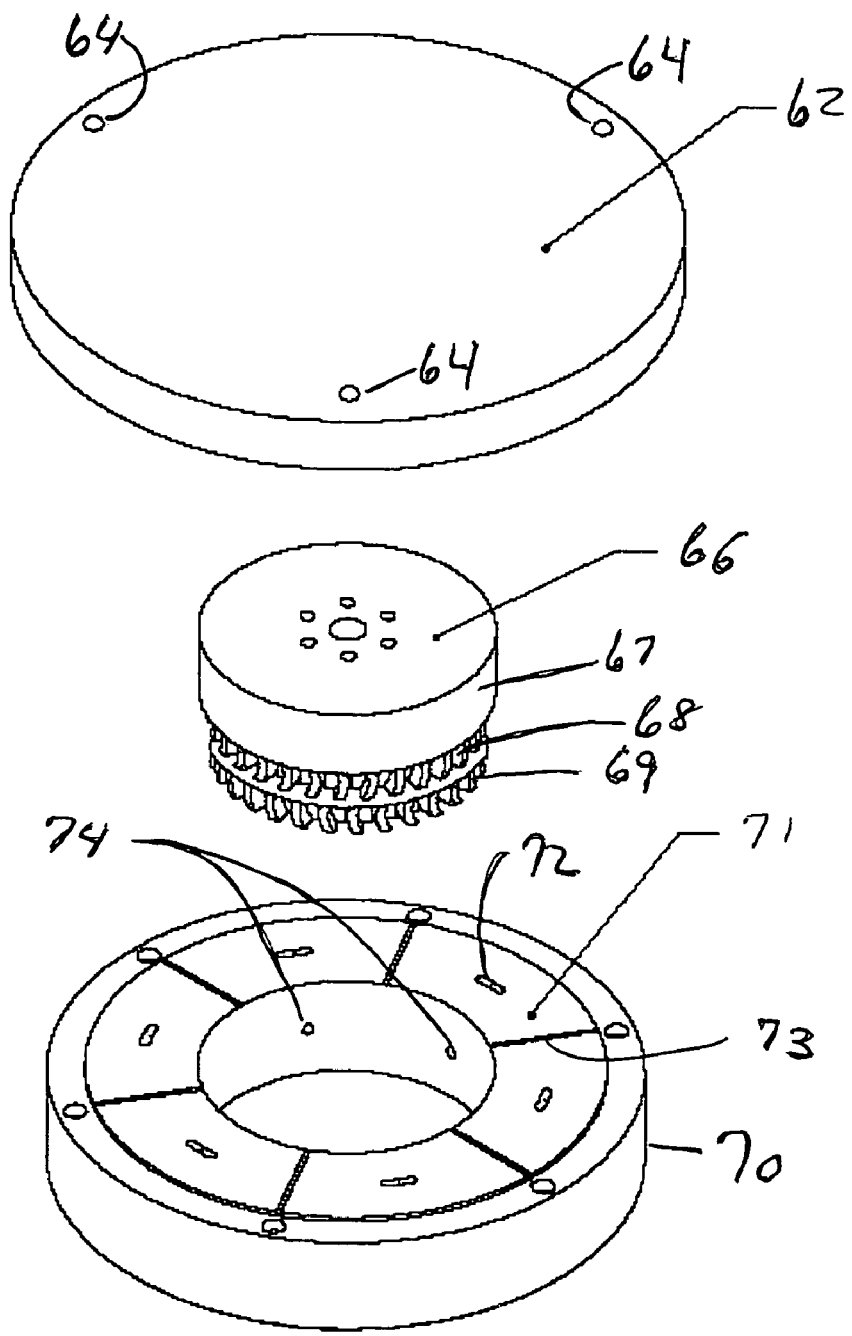
FIG. 9 is an exploded perspective view of the embodiment of FIG. 8, illustrating the fluid operated rotary device journal shaft configured with fluid turbine blades and the base component with fluid ports, beneath the wafer support platform.

Referring to FIGS. 8 and 9, in some embodiments, a fluid operated rotary device 60 is used to rotate the workpiece in the processing chamber, rather than an external motor coupled by a magnetic drive. The assembly consists of wafer platform 62 with holes 64 for mounting wafer retention clips or other wafer or impellor holding structure. To the underside of the wafer platform 62, there is attached the fluid bearing journal shaft 66, with shaft centering surface 67, counterclockwise fluid turbine blades 68, and clockwise fluid turbine blades 69. The platform and shaft comprise the rotating component of the fluid bearing assembly, and nest in fluid bearing base 70.

The upper surface of base 70 is configured with sectors 71 configured with fluid levitation ports 72 and divided by fluid return channels 73. Turbine fluid drive ports 74 are visible within the center bore of base 70. There are drive ports at two levels, corresponding to the height of respective clockwise and counterclockwise turbine blades 68 and 69 on journal shaft 66. The turbine drive ports are configured nearly tangential to the center bore wall so as to eject a fluid stream against respective turbine blades. Smaller centering ports 75 (not shown) are uniformly disposed around the centerbore at a level consistent with centering surface 67.

Figure 10:
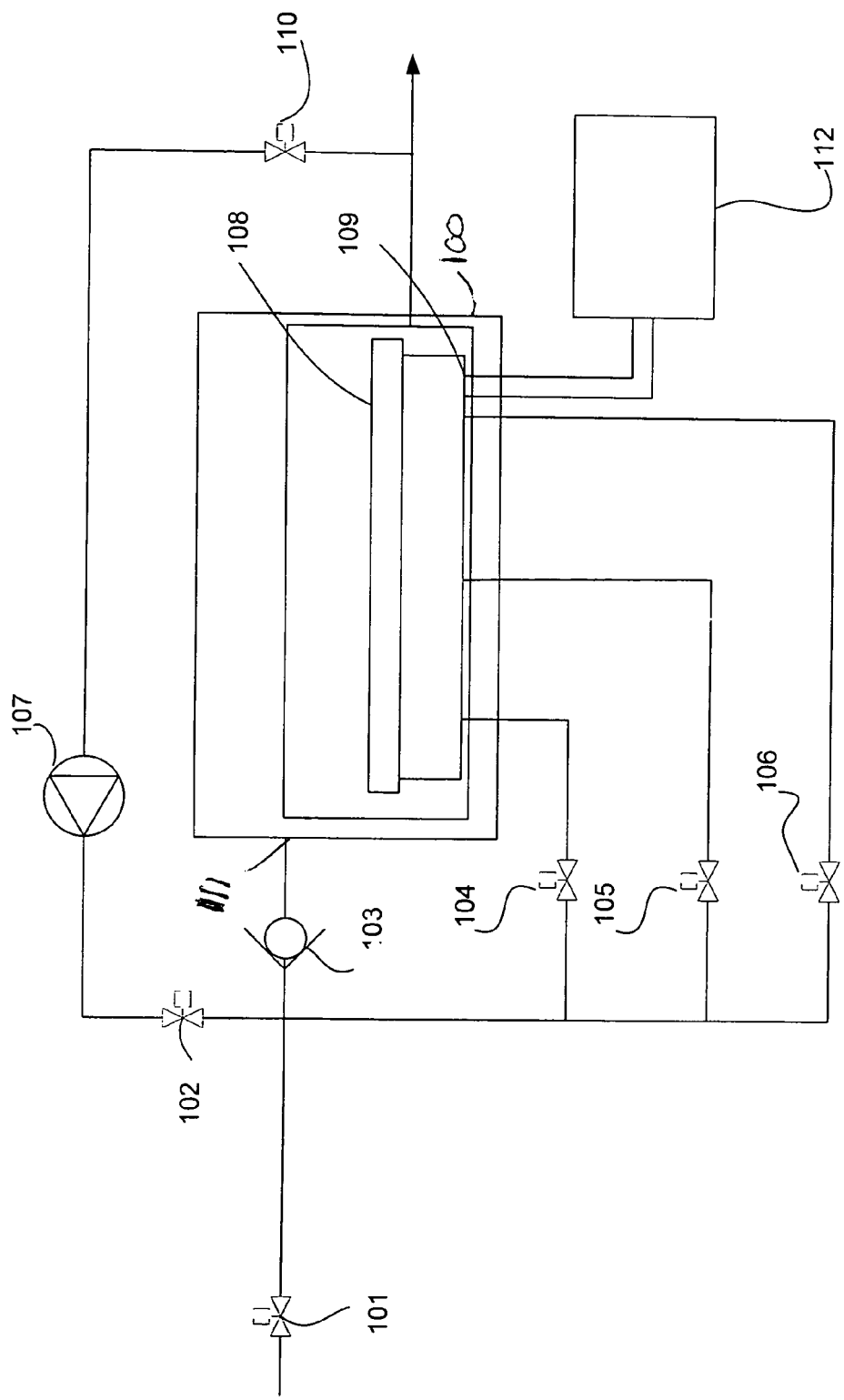
FIG. 10 is a fluid flow circuit diagram for a supercritical process chamber of the invention, further illustrating the rotary control subcircuit by which the fluid powered rotary device is operated, and the pressure reducer by which chamber pressure is assured to be somewhat lower than the rotary control subcircuit pressure.

Referring now to FIG. 10, there is a simplified illustration of one embodiment fluid flow circuit diagram for a supercritical process chamber 100, configured with a single fluid operated rotary device of the type of FIGS. 8 and 9. Process fluid inlet valve 101 connects the $CO_2$ or other process fluid inlet to the process chamber fluid flow circuit. Recirculation valves 102 and 110, and recirculation pump 107 permit recirculation of process fluid from the process fluid outlet back to the inlet side of the chamber. Check valve 103 provides for a predetermined pressure reduction in the fluid flow going into the primary inlet 111 of pressure chamber 100. Control valves 104, 105, and 106 admit fluid flow at full pressure into fluid operated rotary device 108, so as to provide the pressure differential necessary to operate the bearing within the pressure chamber.

Figure 11B:
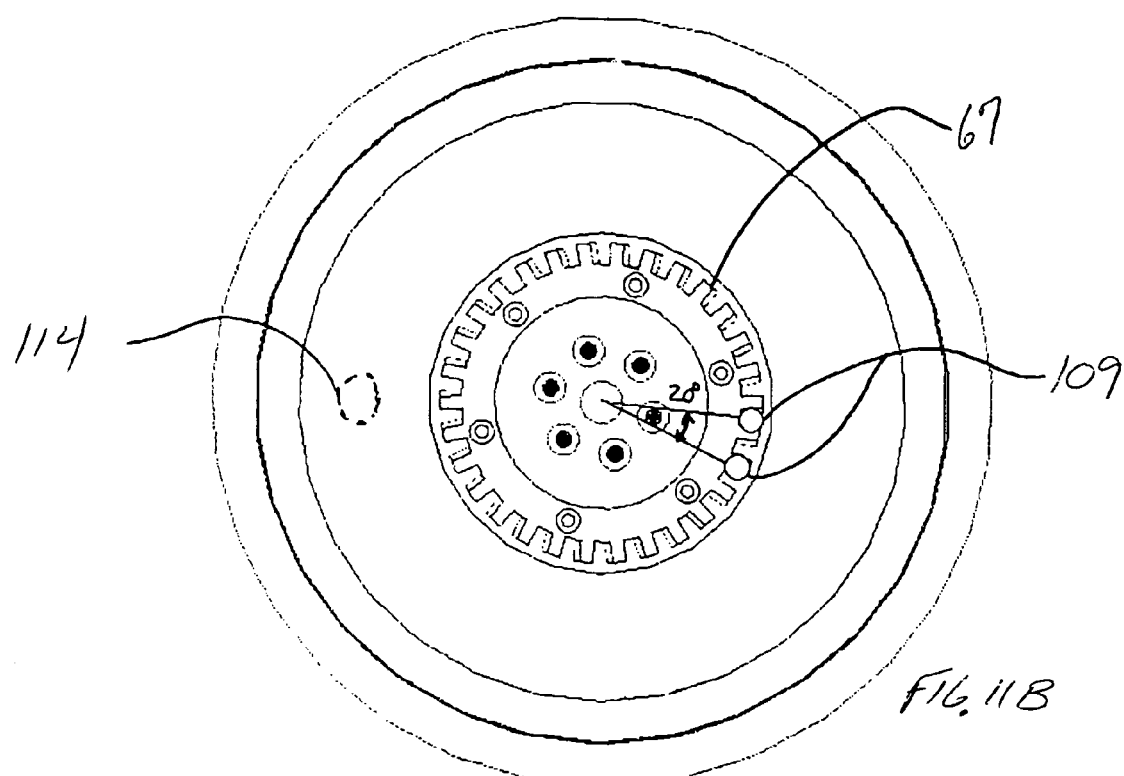
FIGS. 11A and 11B are cross section and planar views of an illustration of dual sensor placement in the turbine section by which speed and direction of rotation can be monitored and controlled, and an electromagnetic rotational home position mechanism.
Figure 11A:
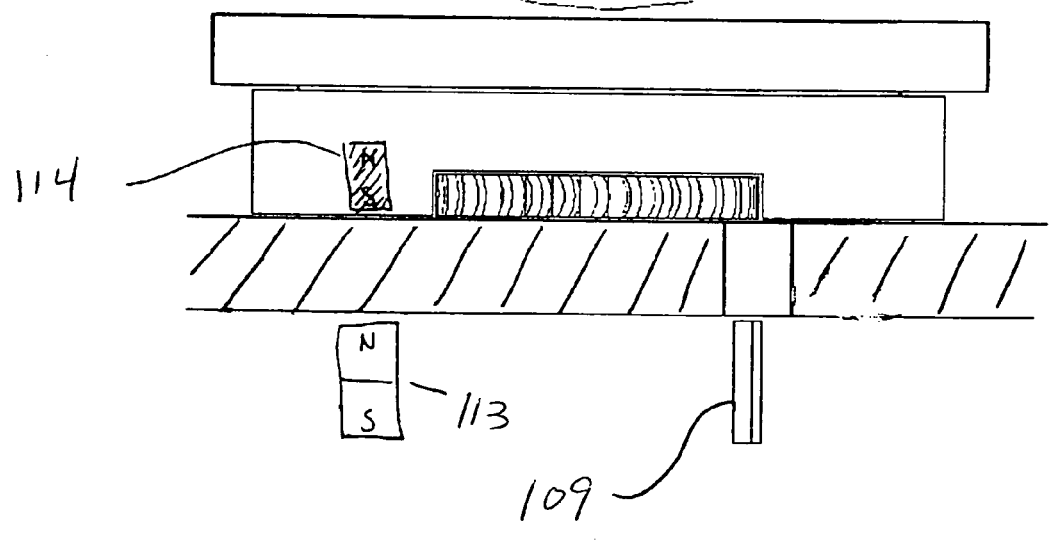

Of these three control valves, valve 105 provides fluid flow for centering and levitation of the rotational component or wafer holder of fluid operated rotary device 108. Valves 104 and 106 provide respectively for clockwise and counterclockwise direction of turbine fluid flow for accelerating and decelerating the rotational component or wafer holder in the desired direction, and reversal of direction if desired. Referring to FIGS. 11A and 11B, a pair of sensors 109 indicate the direction and speed of rotation by using the unique identity and angular displacement of the sensors. Again referring to FIG. 11, the bearing is brought to a predefined home position for wafer loading and unloading by operation of an electromagnetic circuit formed by stationary electromagnet 113 and ferrous target 114 embedded in the rotating component of the bearing. One skilled in the art will readily appreciate that the target 114 may be composed of various materials, not necessarily ferrous in composition, but having adequate magnetic attraction to overcome the momentum of the rotating component and load.

Referring again to FIGS. 10 and 11, controller 112 receives inputs from sensors 109, enabling speed and rotation reporting and control (control lines omitted for clarity) of speed and rotation by operation of valves 104 and operation of electromagnetic homing circuit 113, 114 for asserting home position for the wafer support platform. Controller 112 may be a local controller, station computer, or integrated function of a central computer system.

It should be noted that the fluid in the overall fluid flow control circuit might be in any of liquid, gas or supercritical phases or state, depending on details of the particular process and system. Various embodiments typically handle temperatures to 150° C. and pressures to 10,000 psi (pounds per square inch), although higher temperatures and pressures are within the scope of the invention. In accordance therewith the fluid flow control circuit may have additional heaters, pumps, mixers, reservoirs or other devices affecting temperature, pressure and flow, placed as required. There may be further or additional sources of additives introduced at selective points in the circuit in order, for example, to admit only CO2 or pure process fluid into the rotary device and CO2 or process fluid with additives and/or surfactants into the process chamber's primary inlet 111. It is further understood that the outflow of the process fluid from the process fluid operated rotary devices of the invention is simply discharged into the chamber interior, and must therefore be taken into account as an additive component to the chamber primary fluid inflow and resulting chamber pressure. Periodic or continuous additional chamber outflow may be required if a near constant pressure differential is needed for the rotary device.

Figure 12:
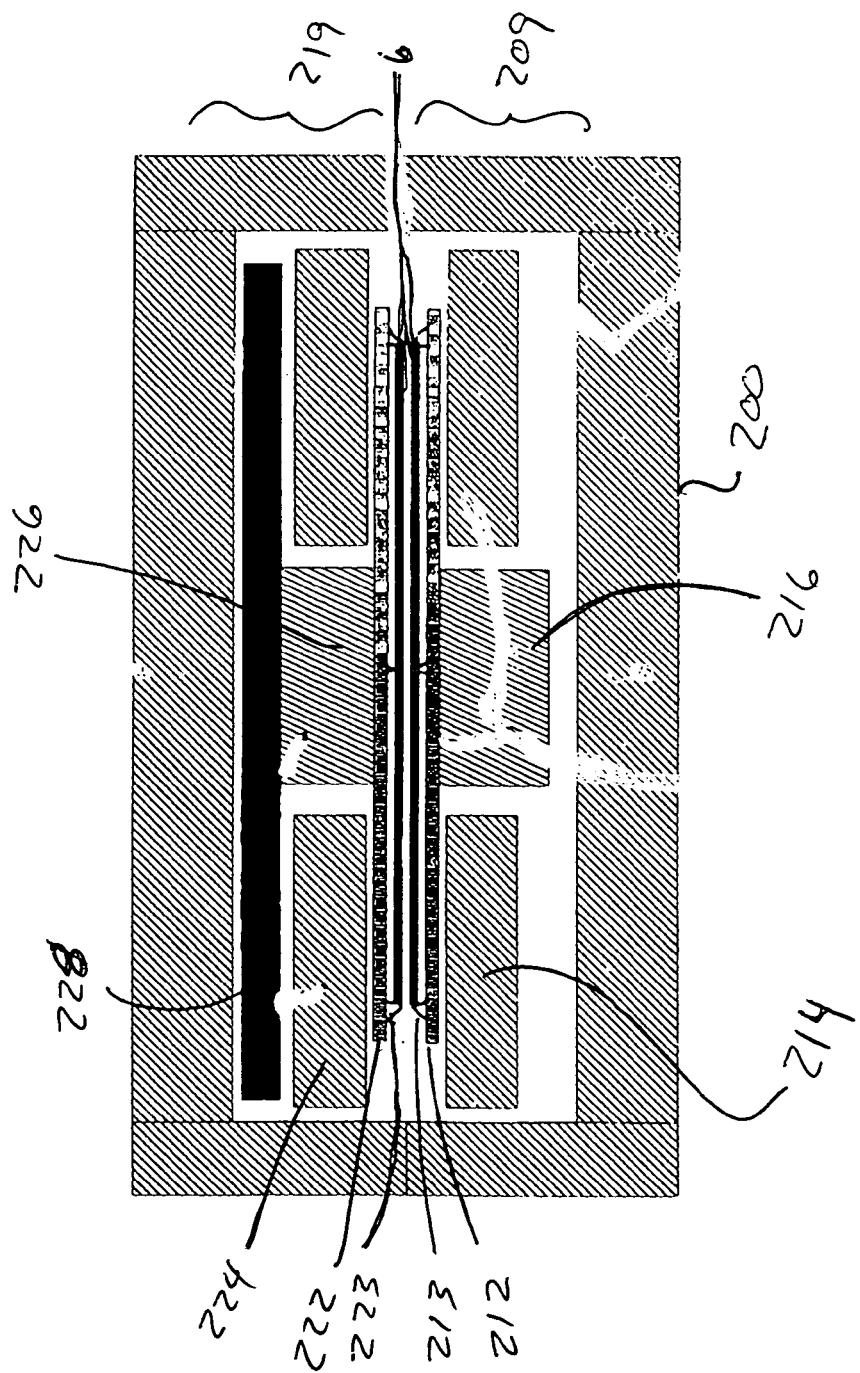
FIG. 12 is a cross section diagrammatic view of a pressure chamber configured with upper and lower fluid operated rotary devices for supporting and rotating two wafers in a face-to-face orientation.

Referring now to FIG. 12, there is shown a cross section diagrammatic view a pressure chamber 200 of one embodiment of the present invention, configured with lower and upper fluid operated rotary devices 209 and 219 respectively, for supporting and rotating two wafers 6 in a face to face orientation. Lower fluid operated rotary device 209 is substantially the same as fluid operated rotary device 109 of FIGS. 10 and 11, having a wafer support platform 212 affixed to a bearing journal 216, which is centered in and levitated slightly upon bearing base 214. Upper fluid operated rotary device 219 is the same in principle as lower bearing 209, except that the wafer support platform 222 is attached to the bottom of bearing journal shaft 226 and a planar lifting section 228 is attached to the top. This rotable assembly of components is centered in and levitated slightly upon bearing base 224. Wafer support platform 222 is configured with wafer holding clips 223 to hold a wafer or other circular workpiece 6, preferably with the side to be cleaned, if only one, facing downward. Wafer support platform 212 of lower fluid operated rotary device 209 is configured with wafer holding clips 213 for securing a wafer 6 as shown, facing upward. The fluid control circuits are similar to what is described in earlier embodiments, except that upper bearing 219 requires somewhat modified fluid return paths so that control fluid flow is directed appropriately and the fluid pressure differential is used effectively, all as will be appreciated by those skilled in the art. It will be further evident that the bearing fluid flow control subsystems may be common or independent, for concurrent or independent operation of each fluid operated rotary device.

Figure 13:
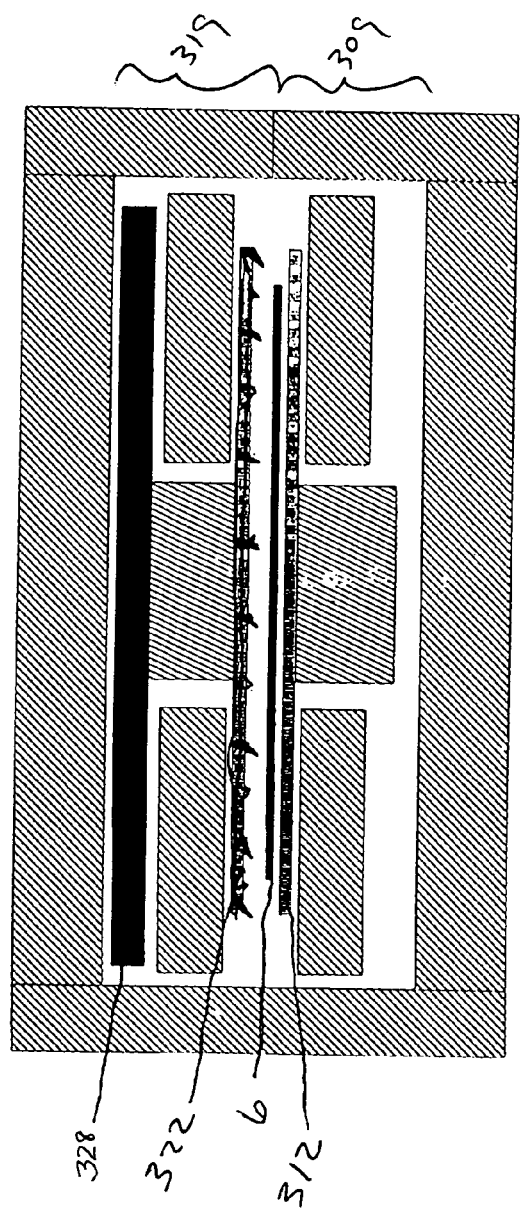
FIG. 13 is a cross section diagrammatic view of a pressure chamber configured with upper and lower fluid operated rotary devices for supporting a wafer holder and an opposing fluid impellor for imparting additional mechanical energy to the fluid within the chamber in the proximity of the wafer face.

Referring now to FIG. 13, there is illustrated a cross section diagrammatic view of a pressure chamber 300 configured with lower and upper fluid operated rotary devices 309 and 319 respectively for supporting a lower wafer holder 312 and an opposing fluid impellor 322 for imparting additional mechanical energy to the fluid within the chamber in the proximity of the face of the wafer 6. This embodiment is configured and operated substantially the same as that of FIG. 12, except that the wafer holder 222 of FIG. 12 is replaced in pressure chamber 300 by impeller 322. It will be appreciated that the proximity of a suitable rotable impeller 322 to a wafer 6 secured to rotable wafer holder 312 will increase the energy level of the process fluid in contact with the surface of the wafer 6.

Referring now to FIGS. 14A–G, there is illustrated a partial perspective view of a stacked wafer holder 400 configured according to one embodiment of the present invention, extending upward from the surface of the rotational component of a fluid operated rotary device such as has been previously described. Support walls 422 are configured with wafer or workpiece flange-like supports 420, each support being configured with a grove or recess 424 configured to receive a wafer 6 to be processed. The workpiece supports 420, according to some embodiments of the present invention, extend peripherally towards the throat opening $W_O$ somewhat more than the full diameter or 180 degrees of the bearing surface perimeter, however the support walls 422 are of sufficiently greater radius than recess 424 so as not to impinge on the required wafer diameter $D_W$ needed for loading a wafer 6 laterally into position in recess 424. Slots 420 are spaced such that workpieces within the slots are vertically separated sufficiently for effective fluid flow consistent with process objectives. Clips, as described more fully below, are oriented and operated so as not to interfere with throat clearance $W_O$ when the unit is stationary for loading and unloading.

Figure 14:
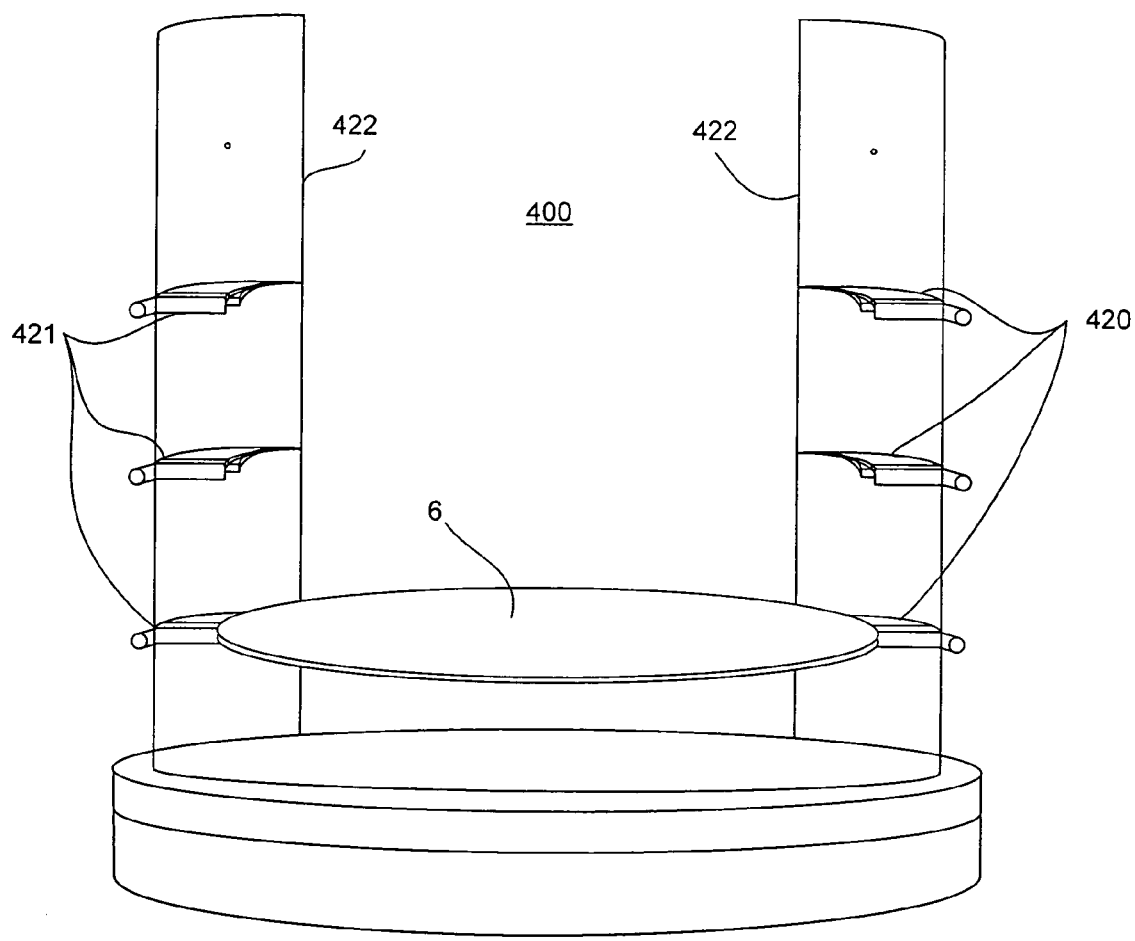
FIG. 14A is a partial perspective view of a stacked wafer holding mechanism mounted on a fluid operated rotary device of the invention.
FIGS. 14B and 14C are a top and close up partial perspective views respectively, of the centrifugal operated securing clips on the stacked wafer holding mechanism of FIG. 14A.
FIGS. 14D and 14E are top and close up side elevation views respectively, of a three clip set of centrifugal operated securing clips on a stacked wafer holding mechanism similar to that of FIG. 14A, the clips in this case having a hold down tip that secures the workpiece from vertical departure from the workpiece slot, as shown in FIG. 14E.
Figure 14B:
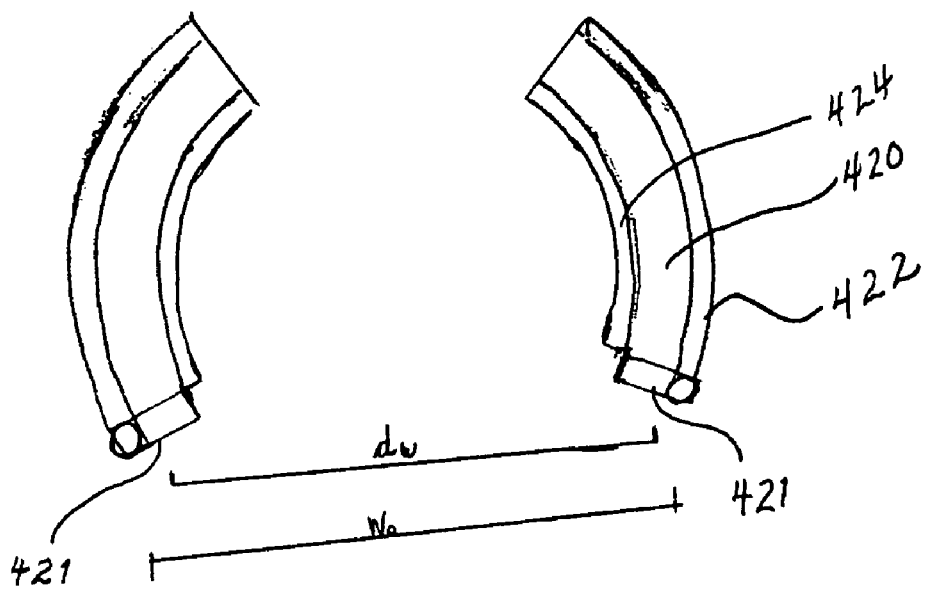
Figure 14C:
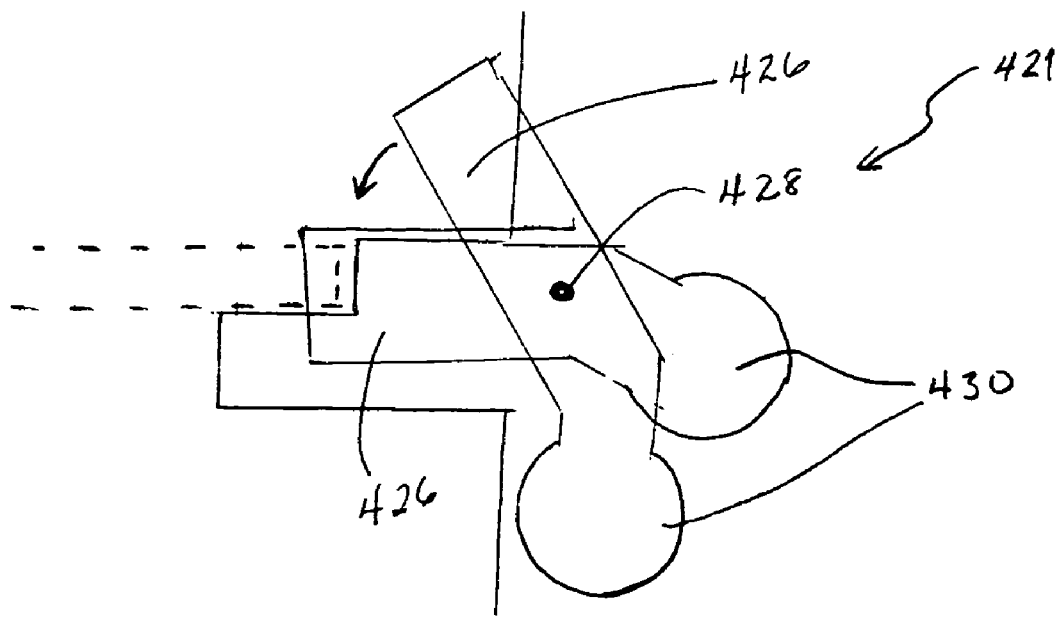
Figure 14D:
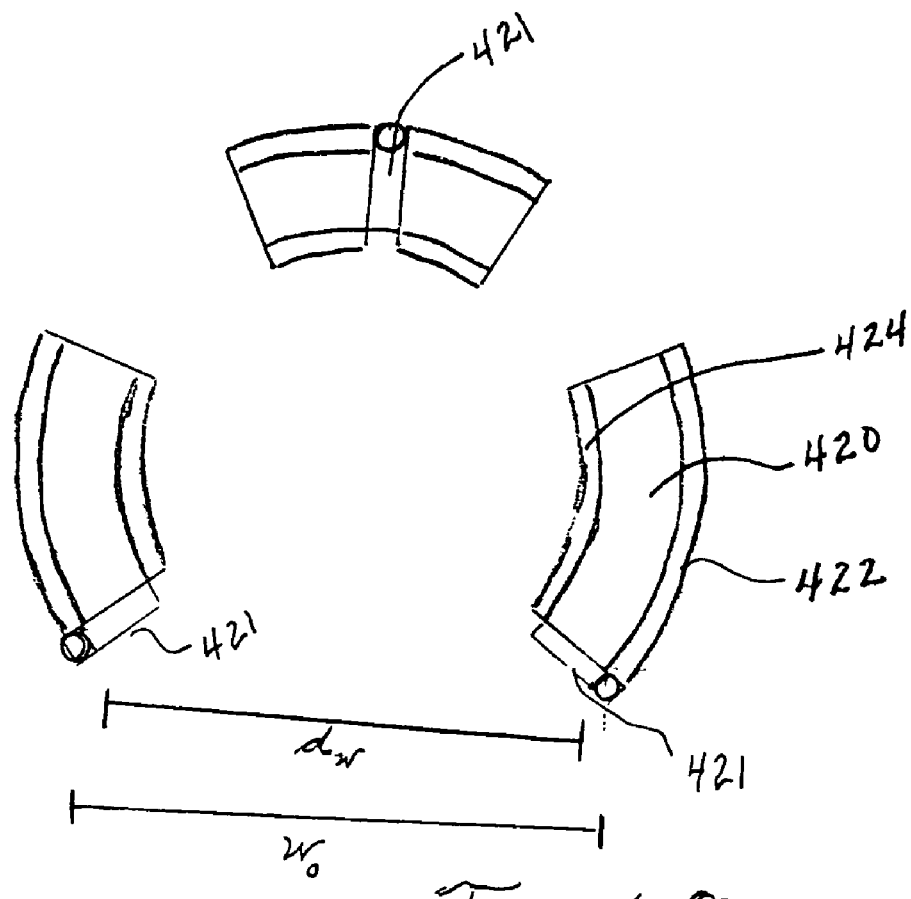
Figure 14E:
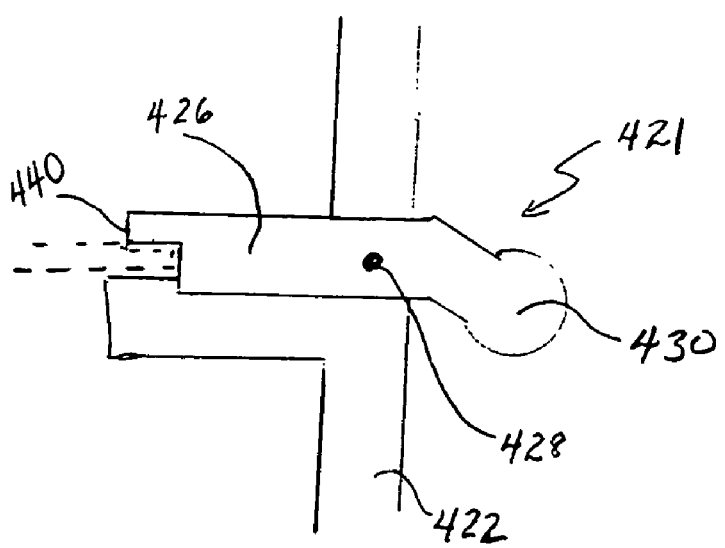

Referring to FIGS. 14B–14E, there are illustrated wafer clips 421 at the outboard or loading ends of slots 420 which are loosely hinged at a point other than at their center of gravity so as to fall open when there is no rotary motion, and to swing into a horizontally oriented closed position with the centrifugal force of rotation. As in FIG. 14D, additional wafer clips 421 may be disposed at various locations around the arc of the workpiece supports 420. Such clips 421, according to one embodiment, are engaged when centrifugal force, applied by the rotation of the stacked wafer holder 420 causes the wafer clips 421 to rotate from an open position to a closed position, as illustrated in FIGS. 14C and 14E. In this closed position, the clip 421 serves as a peripheral extension of the support 420 and shoulder of recess 424, thereby restricting the lateral movement of the wafer out of its recess.

As illustrated in FIG. 14 C, such a clip 421 may comprise an arm 426, a pivot point 428, and a counter weight 430. The arm 426 may extend from the pivot point 428 to the inside of the ridge 424, and the counter weight 430 being disposed on the opposing side of the pivot such that the when in motion, centrifugal force acting on the counter weight 430 deploys the arm 426, blocking lateral movement of the wafer or workpiece 6. In an alternative embodiment illustrated in FIG. 14E, the clip 421 may further comprise a profile 440 for retaining the clip vertically within the slot 420.

When the host pressure chamber is open for loading, a robot carrier may insert or extract one or several wafers 6 in a single motion cycle. Alternatively, the wafer holder or cassette may be removed from the chamber, wafers 6 may be preloaded into the stacked wafer holder or cassette, and in the chamber loading process, the loader or cassette be installed on the load bearing platform of the rotary device.

Figure 15:
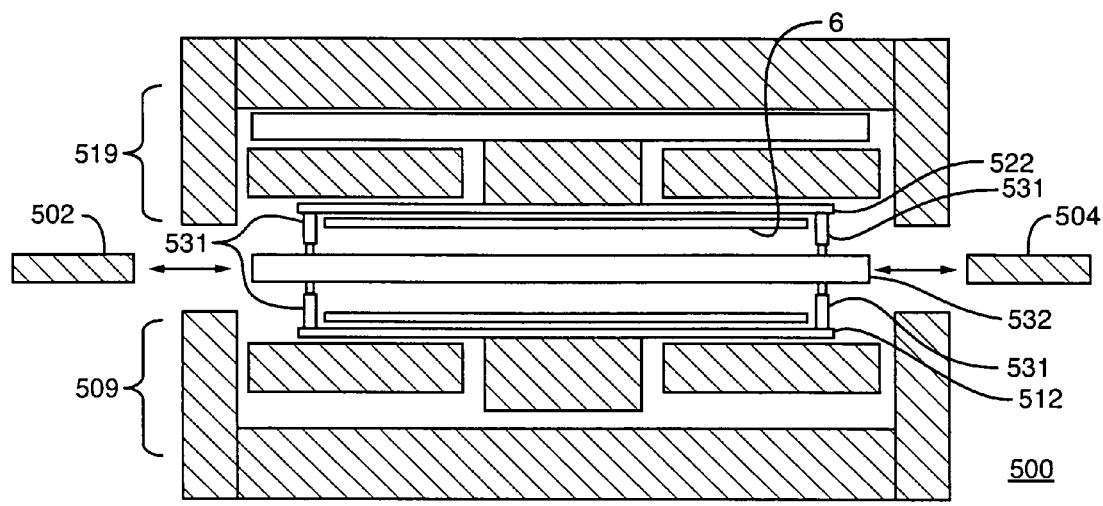
FIG. 15 is a diagrammatic cross section view of a chamber with upper and lower fluid bearing mechanisms configured for receiving wafers from a wafer loader on the left, and thereafter receiving an impellor from an impellor loader on the right, where closure of the chamber brings the loaded fluid bearings into a coupled relationship.

Referring now to FIG. 15, there is illustrated a diagrammatic cross section view of a chamber 500 of one embodiment of the present invention, with lower and upper fluid operated rotary device 509 and 519 respectively. These fluid operated rotary devices are configured and operated substantially as the prior examples of lower and upper fluid operated rotary device embodiments. However, the chamber in this case is configured for receiving wafers 6 from a wafer loader 502 on the left. The wafer loader 502 is typically a robotic device, which in a singular or in repetitive motions loads wafers 6 on the respective lower and upper wafer supports 512 and 522. The wafer supports 512, 522 are configured with wafer holding clip mechanisms as previously described, and are further configured with impellor 532 holding clips 531. The chamber is further configured with a robotic loader on the right. After the wafers 6 are loaded, impellor 532 is loaded into impellor holding clips 531 from the impellor loader 504 on the right. Closure of the chamber brings the loaded fluid operated rotary devices into a coupled relationship with impeller 532 disposed in between the lower and upper wafers or workpieces 6. The introduction of the rotating impellor 532 adds further energy to the fluid/wafer interface, further enhancing the effects of the process.

It will be appreciated that the left-right orientation of the wafer loader 502 and impellor loader 504 is arbitrary. Any placement of one or more loaders that provides the desired functionality for loading any of wafers, impellers, cassettes, or a combination thereof is within the scope of the invention.

Furthermore, as in the stacked wafer embodiment, a wafer cassette that includes preloading of one or more impellers interspersed with wafers 6 so as to have an impeller proximate a wafer face, followed by loading of the cassette into the chamber, is within the scope of the invention.

In these embodiments, the gas or fluid supplied to support and drive the fluid operated rotary devices may come from an independent external source or device, but various embodiments employ $CO_2$ or other process fluid from the processing fluid stream feeding the process chamber. The fluid used for support may enter the chamber from the same manifold used to deliver the process fluid stream, or it may enter through separate input ports and directions, but serving the same function as to center and float the rotating assembly, and spin the rotating device in a manner consistent with the advantages of air bearings, thus minimizing friction and providing smooth mechanical rotation at high speed. The speed of rotation would include, regardless of the specific mechanism, the capability to reach several thousand revolutions per minute. One familiar with details of the art and practical employment of such a device will appreciate the benefit of a low friction, and low particulate, gas-driven mechanism as higher rotational speeds are utilized. The mechanism has the capability of a wide range of speeds, and the capability of variable speed and direction during operation, such variation possibly directed or programmed to occur during a given process cycle.

Figure 16:
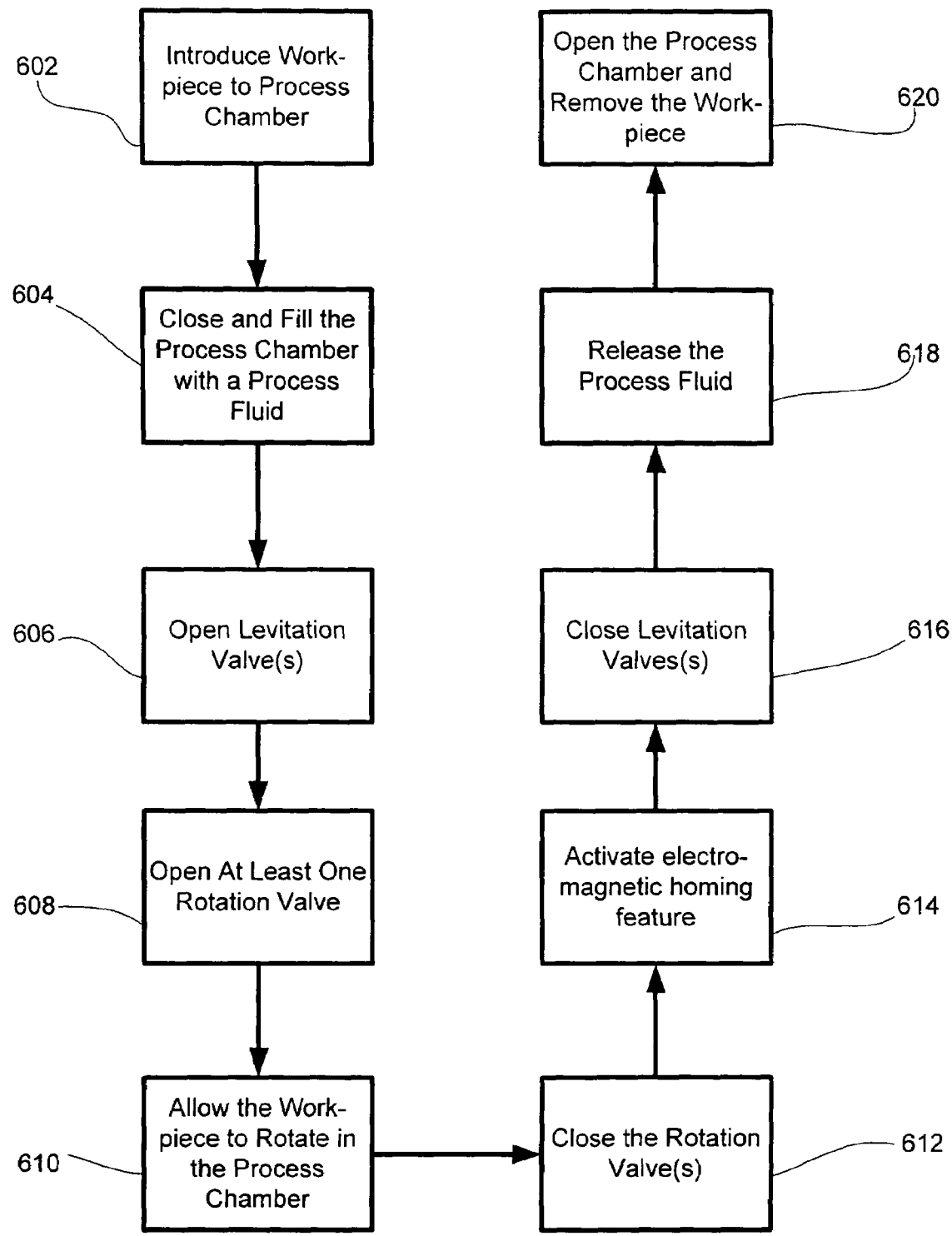
FIG. 16 is a flow chart of the process by which a rotary device of the invention is operated.

The invention is susceptible of methods as well as apparatus. FIG. 16 is a block diagram of a basic process 600 employing such an apparatus. In this process 600, a work piece is introduced into a process chamber. This placement may, according to some embodiments be made by a wafer placement robot or such other mechanical placement apparatus. Once the workpiece is placed within the chamber on the workpiece support, the process chamber is filled with a process fluid. This process fluid, as discussed above may be a fluid in the gaseous, liquid, or supercritical state. Once the chamber is filled, at least one valve is opened whereby a fluid, according to one embodiment of the present invention, this fluid is supplied from the same source as the process fluid, is introduced to the chamber through ports, causing a pressure differential between regions above and below the support, thereby causing the workpiece support to raise or levitate, and to center on its axis or core of rotation. Other valves may then be opened to induce rotational movement of the workpiece support in either the clockwise or counter clockwise direction, depending on the direction of the flow. The workpiece is thus rotated in the process fluid until the workpiece is substantially free of contaminants or a set time has elapsed. During this rotation, sensors may monitor the speed of the rotation, as well as other process parameters.

When the rotation of the workpiece has been completed, the valves introducing the fluid flow propelling the rotation are closed. Once the propulsive fluid flow is stopped, but while the levitation flow is maintained, an electromagnet disposed in the chamber is activated, causing the workpiece support to home to a fixed orientation. Levitation flow may then be stopped, by closing the appropriate valve, allowing the support to come to rest in its non-levitated position. Once the support is at rest, the process fluid may be released, and the chamber opened.

Referring again to FIG. 16, it is useful to reiterate the illustrated steps of this embodiment: step 602, introducing the workpiece to the process chamber; step 604, closing and filling the process chamber with a process fluid; step 606, opening the levitation valve that will float the load platform or wafer support platen off its stationary base and center it for non-contact rotation around its stationary base; step 608, opening a control valve for applying torque with process fluid that will tend to cause rotation of the load platform; step 610, allowing the load platform and workpiece to rotate; step 612, when the process has progressed to a satisfactory point, closing the rotation control valve and optionally, opening a reverse torque fluid flow valve long enough to speed the deceleration of the load platform; step 614, activating an electromagnetic home locator circuit to stop the rotation in the predetermined home position; step 616, closing the levitation valve and allowing the load platform to come to a rest on its base; and finally step 620, opening the chamber and removing the workpiece. There are many variations, of course, and further process details that might be employed that do not remove the method from the scope of the invention.

Figure 2:
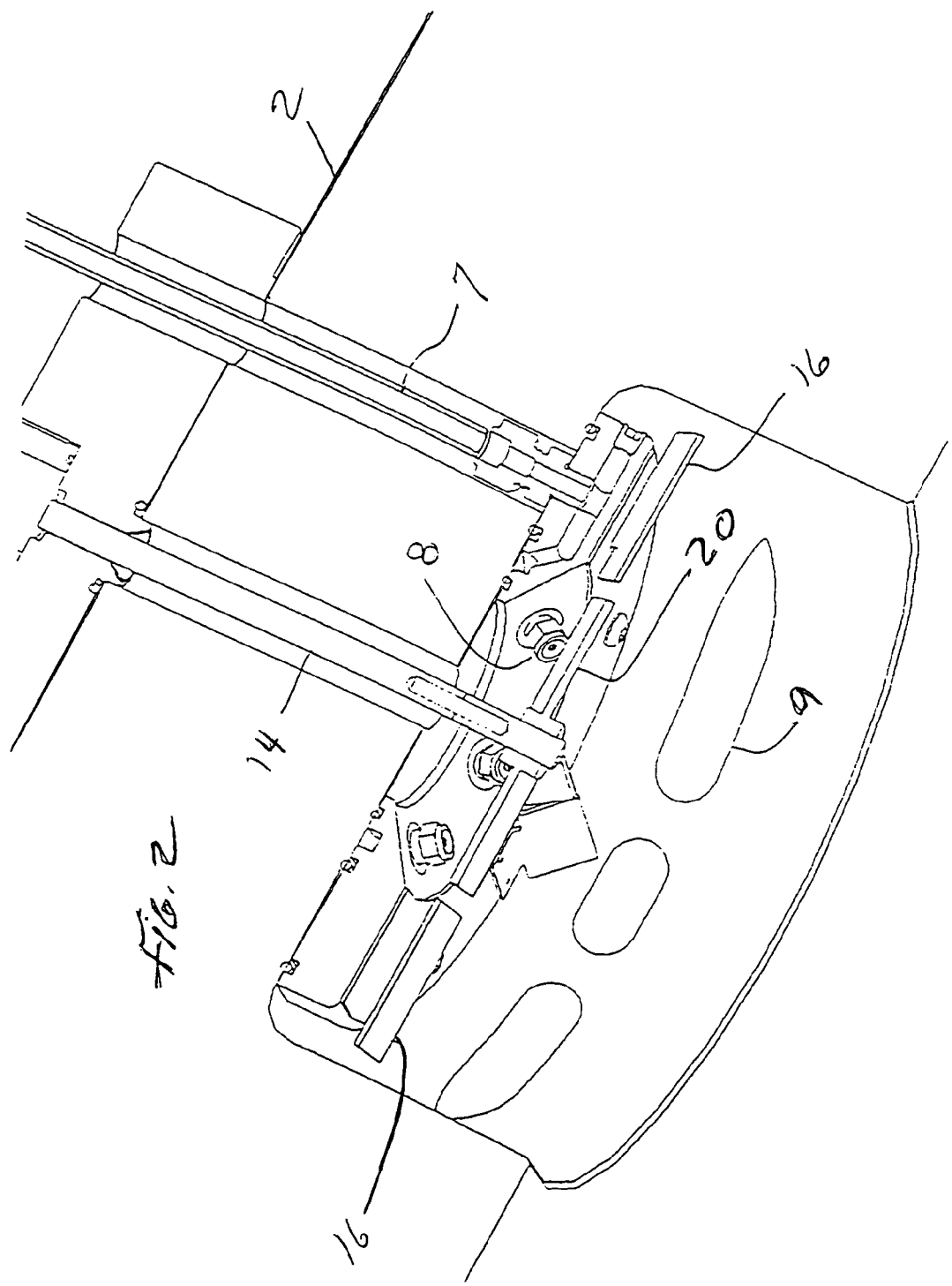
FIG. 2 is a close up perspective cross section view of the embodiment of FIG. 1, illustrating the shaft, impellor, and fixed baffle plates within the cleaning chamber, the substrate removed for clarity.

Referring again to FIG. 1 there is illustrated an upper perspective cross section view of another aspect of the invention, sectioned to the near side of the centerline so that shaft 14 and cleaning fluid feedline 7 of FIG. 2 are contained within the chamber section. Underside lid 4 is equipped with substrate holding pins upon which is supported substrate 6. Referring now to FIG. 2, there is illustrated a close up lower perspective cross section view of the embodiment of FIG. 1, sectioned so as to illustrate shaft 14, feedline 7, impellor 20, and fixed baffles 16 within the processing chamber. Lid 4 and substrate 6 of FIG. 1 are removed for clarity in this view. At least some of the cleaning fluid is injected through feedline 7 to nozzles 8, and removed though chamber ports 9.

As explained previously, high-speed agitation provides an added mechanical force that contributes to the overall cleaning process and in particular to completely removing the softened/loosened materials from the substrate or workpiece surface. In this embodiment, the magnetic agitator coupler 12 is fitted into the top of the process chamber 2, and sealed using either a threaded, collar and gland, or flanged connection. Drive shaft 14 protrudes through the top and into the interior of the process chamber 2. Propeller/impeller 20 is affixed to the bottom of drive shaft 14. The type and style of the impellor may be of various configurations and diameter. The drive shaft is designed to be of a length that will suspend the impellor at the most desirable distance from the surface of the substrate.

Figure 3:
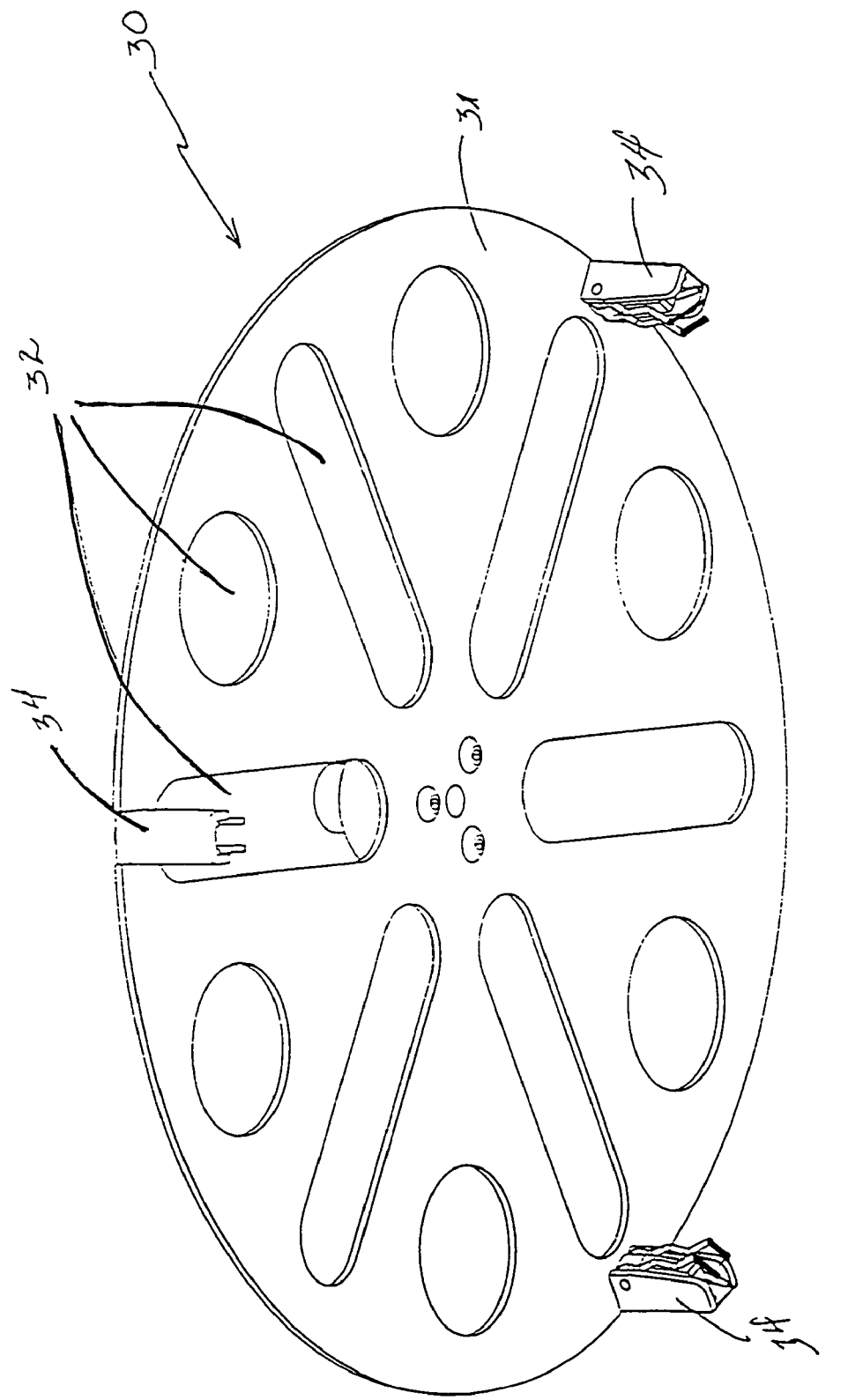
FIG. 3 is a bottom perspective view of a wafer rotation and retention structure with downward projecting spring type wafer clip assemblies in accordance with one embodiment of the present invention.
Figure 4:
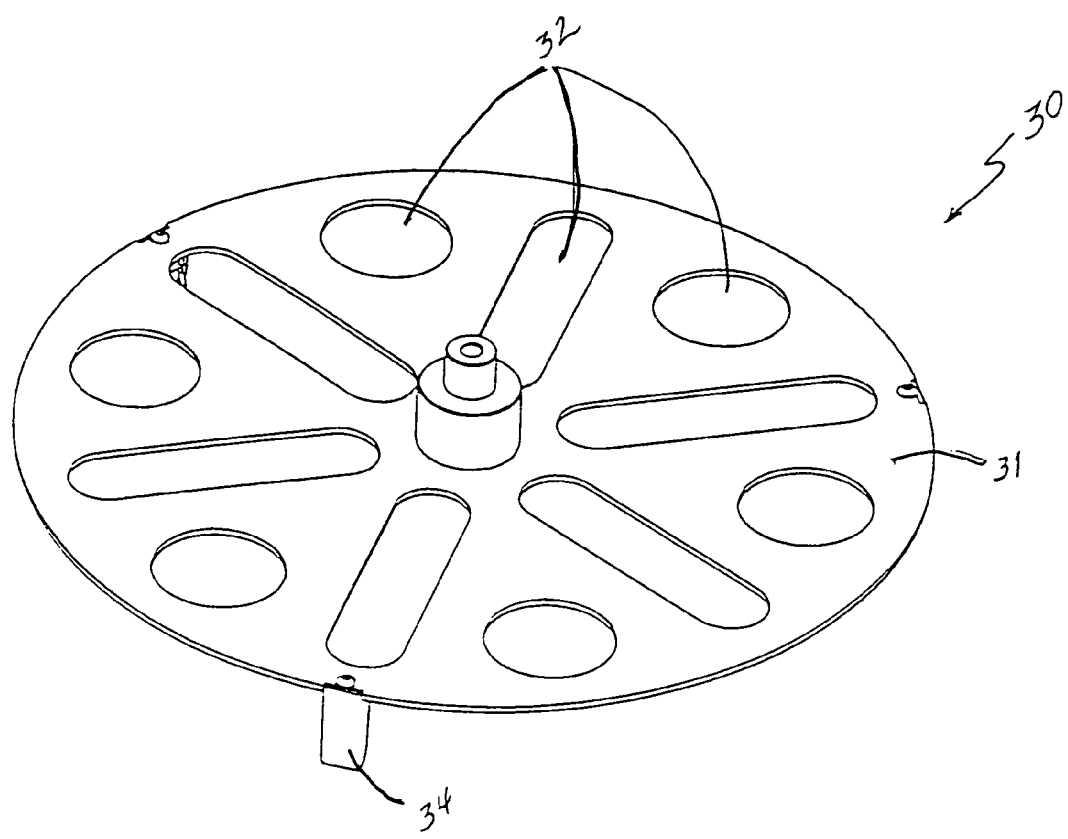
FIG. 4 is a top perspective view of the embodiment of FIG. 3.

As in other embodiments described above, both the impellor and the wafer or substrate 6 may be spun or rotated. In one such embodiment a wafer retention structure 30, illustrated in FIGS. 3, 4, and 6 upon which the wafer 6 is mounted is rotable. In the embodiment illustrated in FIGS. 3 and 4 this structure 30 is a disc 31. In lieu of a disc, a plurality of spokes or arms 40, extending from a central hub 42 and connected by a stabilizing ring 44 or other similar support structure may be used, as illustrated in FIG. 6. The retention structure 30 may be composed of materials and components arranged in a configuration that is designed to withstand the stress and forces resulting from high speed rotation and supercritical temperatures and pressures.

The rotation exposes the wafer 6 to centrifugal force as well as the forces resulting from the passage of the wafer 6 through fluid. In one embodiment, the top surface of the substrate 6 is positioned away from the structure 30, in the downward facing direction. This adds the additional force of gravity. These forces, in addition to the forced flow of the fluid through the chamber inlet to outlet whereby the solvent and removed material is constantly flushed from the chamber, are used to optimize the inherent kinetic properties of fluid so as to improve the efficacy of the co-solvent fluid in cleaning the substrate 6.

The use of rotating wafer retention structures 30 is not limited to use in the inverted process chamber described above. Other, top loading, chambers would be within the scope of the invention. The shaft may be coupled through the lid or hatch of the chamber, rather than through a solid wall of the chamber. Still other embodiments do not require the wafer 6 to be mounted upside down. For example, the rotating wafer retention disc may be disposed on the bottom or side of the process chamber. It may replace or be used in conjunction with an impeller as described above. It may be disposed on the same drive shaft as the impeller or be disposed opposite to the impeller. The drive shaft powering the rotation of the disc may be mechanically or magnetically coupled to an external motor or other rotary power supply. Alternatively the drive shaft may be hydraulically actuated or fluidly coupled to an exterior power supply.

According to one embodiment, the support structure and/or chamber may be configured to permit the flow of fluid to reach both sides of the substrate to be washed. The wafer retention structure, in some embodiments, may comprise scoops, fan type deflectors, or ridges to propel fluid through perforations 32 in the structure 30 while the structure is rotating supplementing the kinetic benefits of the invention, providing agitation, initial fluid flow vectors substantially normal to the wafer 6. The wafer 6, as a result of its spinning motion is exposed to flowing solvent along its path of rotatory motion, while the solvent is forced radially over the surface to be cleaned. This functionality is equivalent to the impeller of previously embodiments, here combined with wafer holding clips.

The structure 30 comprises a non-reactive material that is capable of resisting the co-solvent mixture and the high temperature and pressure of the cleaning process. In one embodiment of the present invention, the top of the wafer 6, i.e. the side of the wafer 6 for which cleaning is most critical, is mounted proximal to the structure 32, exposing the top to the full force of the fluid. Thus, with the rotation of a single part, fluid flow and turbulence is created, and the wafer 6 is spun, exposing the material to be removed to a variety of forces, and to a fluid with a high kinetic energy. These forces work in concert with the continuous flow of solvent through the process chamber. This combination facilitates both the dissolution of the material and its physical removal and delamination.

Figure 5B:
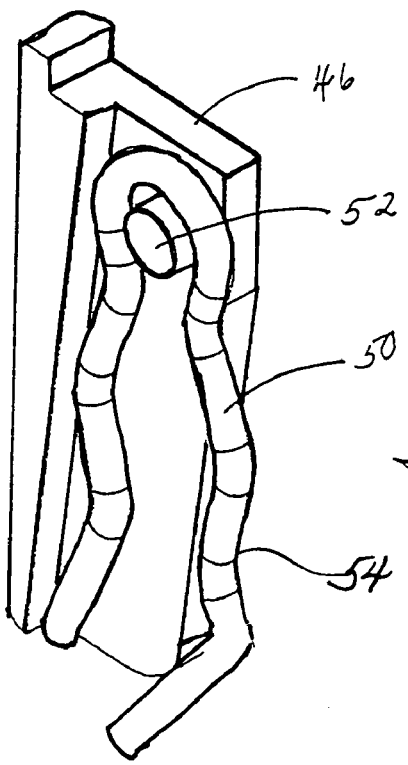
FIG. 5B is a cross sectional perspective view of the wafer clip assembly of FIG. 5A, showing the compression spring and support structure.
Figure 5A:
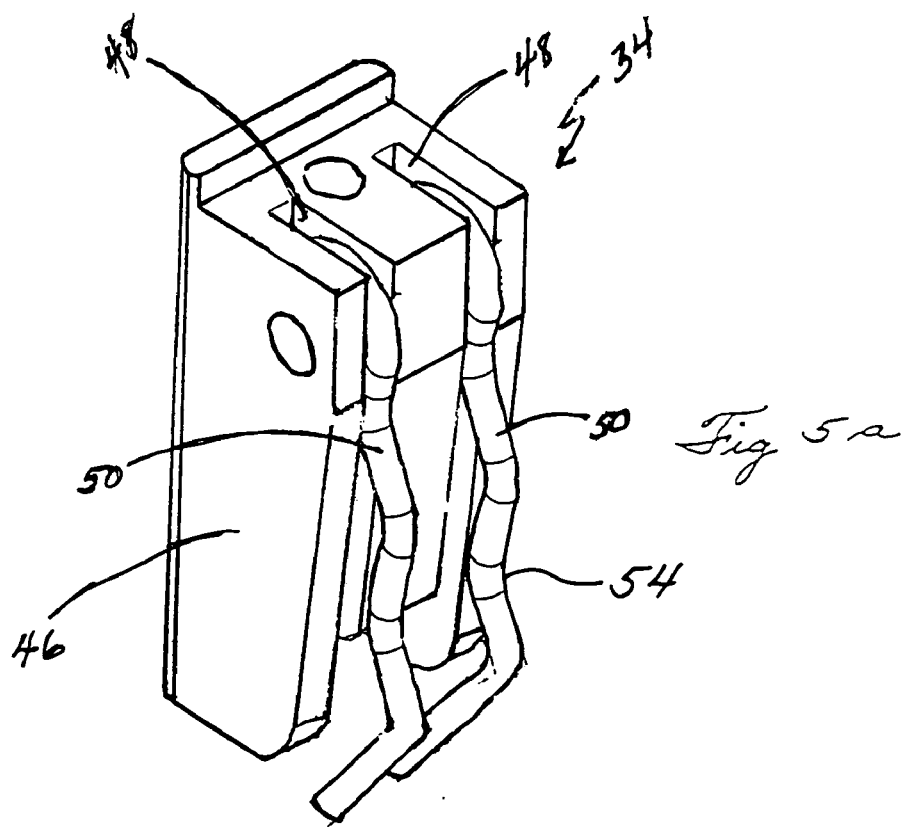
FIG. 5A is a detail perspective view of a spring type wafer clip assembly of FIG. 3.

According to one embodiment, the structure 30 retains the wafer 6 through the use of clips 34 that are configured to hold the wafer 6 at a desired distance from the body of the disc. The clips are susceptible to a number of embodiments, all within the scope of the present invention. According to one embodiment, illustrated in FIGS. 5A and 5B, the clips may comprise a clip support 46, with spring clip slots 48, within which spring clips 50 are pinned by pin 52. Spring clip 50 is a U shaped clip formed to grip pin 52 whether used upright or upside down. The spring clip 50 may, according to one embodiment, be made from a resilient wire, having sufficient flexibility to be temporarily deflected by an outside force, but sufficient memory to return to its original configuration when that force is removed. Spring clip 50 is further formed and configured with detent 54 available on the inward or wafer edge side. Spring clip 50 is compressed radially outward against support 46 by contact and vertical motion of a wafer edge near its open end, for acceptance, and limited expansion and gripping of the wafer edge at detent 54. The compressive strength of the plurality of clips 50 on the wafer, about the periphery of the wafer, hold it in place during rotation.

Figure 7:
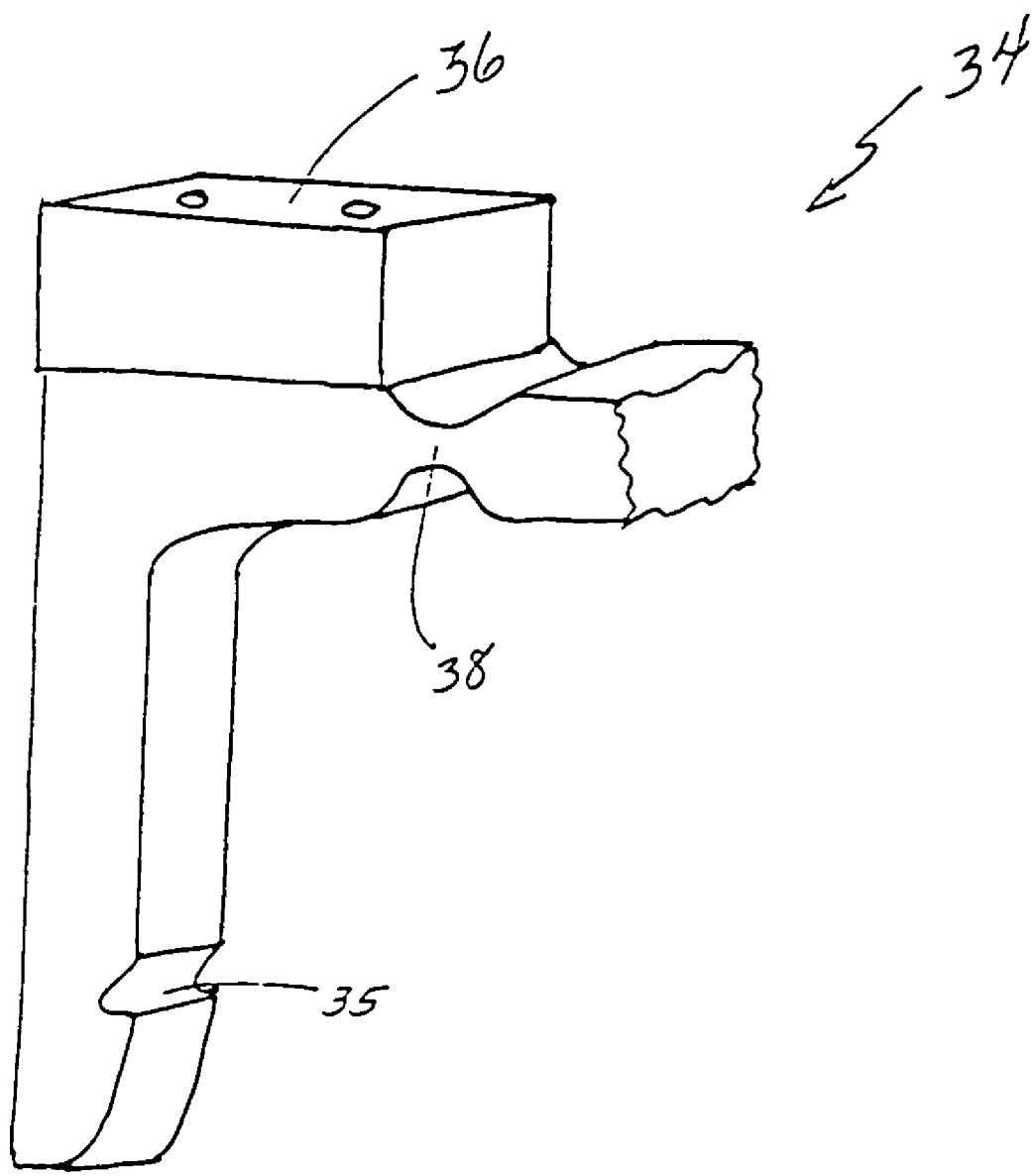
FIG. 7 is a detail perspective view of a wafer retention clip having a centrifugal force actuated counter balance.

Referring now to FIGS. 6 and 7, peripherally disposed clip fingers 34, each provided with an inwardly facing notch 35, extend vertically or perpendicularly a desired distance from the arm and plane of the wafer support structure 30 for holding and processing a wafer 6. The connecting hinge 38 between the clip fingers and support 30 is flexible, as by a living hinge mechanism or other common hinging design, so as to permit the clip finger to flex open with wafer loading, allowing for the facile placement and removal of a wafer 6 from notch 35 of each finger 34. The opposing end of clip finger 34 is adapted with a counterweight 36, which reacts with centrifugal force by the same flexing capability to apply a gripping force to the wafer held in notch 35. This arrangement provides proper gripping at normal operating speeds and compensates for irregularities in wafer size and grip quality.

When the wafer 6 is initially transferred to the processing chamber, a robot or automatable mechanical contrivance is typically used. Such systems will be familiar to those skilled in the art, and a suitable minor modification in the programming of such a device would be necessary to place the wafer 6 into the grip of the rotating assembly. This mechanical action is a simple vertical translation, after horizontal positioning, and the wafer 6 is thus inserted past the open catch on the spring. A similar reciprocal action is used to retrieve the workpiece. Wafer, workpiece or substrate handling systems can be configured for flipping a substrate prior to insertion into the chamber, where it is desired to have a particular side up. It is within the scope of the invention that a workpiece can be removed, turned over, and processed again if desired, insuring that both sides have received substantially equal processing effect.

One skilled in the art will readily appreciate that other clip or gripping mechanisms would be within the scope of the present invention. Such clip mechanisms securely hold the wafer 6 to the retention structure 30, at a desired distance. By keeping the wafer 6 at a distance from the retention structure 30 the clips insure maximum exposure of both sides of the wafer or substrate 6 to the supercritical fluid and co-solvent, permitting the apparatus to clean both sides of the wafer 6 simultaneously.

Referring now to FIGS. 17A–17C, there is illustrated one embodiment of a fluid driven rotary device having a non-rotatable core 742, FIG. 17B, upon which is disposed a skirted, load bearing platform 744, FIG. 17A, having integrated within its skirt first and second turbines 746, 748. In one such embodiment, rotational force is applied to the load bearing platform 744 by the application of fluid streams to one or the other of first and second turbines 746, 748. The direction of the rotation, either clockwise or counter clockwise, is governed by the angle of the respective turbine blades with respect to a jet of fluid striking it. Referring to FIG. 17C, which is a close up perspective of the wall of core 742 of FIG. 17B, the fluid flow streams are directed through one or the other of respective clockwise and counterclockwise sets of directional control apertures 750, 752. These are vertically displaced on the core wall for alignment with their respective turbines. Apertures 750, 752, may according to one embodiment be disposed with exit angles nearly tangential to the core wall, maximizing application of the force of the fluid flow on the turbine blades.

The skirt of load bearing platform 744 is further configured with platform centering collar 754. This platform centering collar 754, may in one embodiment be disposed between the first and second turbines, while other embodiments may provide one or more such collar 754 disposed in an alternative position. This collar 754 in combination with fluid flow from a plurality of platform centering fluid apertures 756, act in an analogous way to a traditional fluid bearing, centering the core 742 within the collar 754, in a rotable, substantially friction free state.

The load bearing platform 744 is lifted or levitated by fluid flow directed through levitation apertures 758 disposed in the top surface 760 of the core 742. These levitation apertures 758 direct fluid towards the underside of the load bearing platform 744. This fluid flow induces a pressure differential between the apertures and the exhaust channels proximate the apertures, and moreover, between the underside and the topside of platform 744, which lifts the platform slightly above top surface 760. The spent fluid is then channeled away from the interior of the rotary device, in some cases over the edge and out the first turbine 746, contributing somewhat to rotation. This pressure differential counteracts gravitational or other vertical forces applied to the load bearing platform 744, enabling friction free rotation of the platform.

According to one embodiment, each levitation aperture 758 is disposed within a segment of the top surface 760. This segmentation of the surface is configured to avoid turbulence and uneven distribution of the fluid flow, which would result in unsteadiness in the load bearing surface 744. Some embodiments may provide a fluid flow sink 762 disposed in the center of the top surface 760. This sink provides a means for removing spent fluid from the region above the top surface without fluid escaping through the first turbine 746 and resulting in unintended rotational force. Alternative means for preventing such undesired rotational torque may include careful balancing of clockwise and counter clockwise fluid flows, when no rotation is required.

The invention is susceptible of many embodiments and variations. For instance, it will be appreciated that the fluid operated turbine drive of the rotary unit, even without fluid-supported lift and centering, may be useful in some supercritical phase processing operations for providing fluid coupled rotary motion within the process chamber. Other examples are offered.

For example, there is a system for supercritical phase fluid processing consisting of a supercritical phase process chamber with an exhaust port and at least one fluid operated rotary device inside the process chamber, where the rotary device has a base component and a rotable component, and the base component is connectable to an external source of process fluid at higher pressure than the nominal fluid pressure within the process chamber. The rotable component is configured with a load platform. The load platform is configured with holding clips for securing at least one workpiece, wafer, substrate, or other work in process.

The load platform may be configured with holding clips for securing at least one impeller or other fluid agitating structure such as otherwise described herein the source of process fluid may be a source of process fluid for lifting and centering the rotable component with respect to the base component, as well as a source of process fluid for applying torque to the rotable component, in one or either direction. The source for applying torque to the rotable component may be two sources; one source for applying a clockwise rotation force, and another for applying a counterclockwise rotation force.

The rotary device may be configured with a home position locator such as an electromagnetic circuit between the base and rotating component for stopping the rotating component at a pre-determined rotation angle with respect to the base component. The rotary device may incorporate a speed of rotation indicator, from among the many schemes commonly practiced in this and other rotary applications. The rotary device may also have a direction of rotation indicator, again, any such as are common. The system may further employ a speed and direction of rotation controller, computer, or have such functionality in a central or system computer.

The rotary component may use turbine blades, and the base component have turbine fluid flow ports directed towards the turbine blades, where the turbine fluid flow ports communicate with the source for applying torque the turbine blades may have a first set of turbine blades oriented for applying clockwise torque to the rotating component and a second set of turbine blades oriented for applying counter-clockwise torque.

There may be at least one impeller in the system configured for rotary motion in proximity to the wafer support or load platform. The impeller may be attached to and be rotated by at least one fluid operated rotary device. There may be lower and upper fluid operated rotary devices, each configured with a respective load platform, where the upper fluid bearing has its load platform configured on the lower end of its rotable component.

There may be a workpiece cassette configured to hold at least one of a workpiece and an impeller, and be mountable on the load platform. The workpiece cassette may be configured with at least one workpiece slot with open slot ends for receiving at least one of a workpiece and an impeller, with slot ends configured with workpiece retention clips operable by centrifugal force for closure for securing the workpiece or impeller therein.

As another example, there is a method for the processing of a workpiece consisting of:

placing the workpiece on a rotable load platform of a rotary device in a process chamber, where the load platform is configured with propulsion vanes; closing the process chamber; and controlling an external source of process gas as a rotational propulsion gas flow through a first port of a base component of the rotary device towards the propulsion vanes, thereby inducing the load platform to rotate. There may be controlling of the external source of process gas as a load platform centering gas flow through the base component towards the load platform, thereby causing the load platform to levitate with respect to the base component. There may be controlling of the external source of process gas as a load platform levitation gas flow through the base component towards the load platform, thereby causing the load platform to center with respect to the base component. And there may be controlling of an external source of process gas as an anti-rotational propulsion gas flow through a second port of a base component of the rotary device towards the propulsion vanes, thereby inducing said load platform to cease rotation; inducing of the load platform to come to a home position; followed by opening of the process chamber.

As yet another example there may be a wafer retention system for supercritical processing of wafers, comprising a plurality of wafer retention clips disposed along the periphery on a wafer support structure, each retention clip consisting of a clip support structure, a clip body hingedly connected to the clip support structure with a hinge line oriented substantially parallel to the periphery of the wafer support structure; a first section of the clip body having a wafer contact surface and a second section of the clip body comprising the center of mass of the clip body such that during rotation of the wafer support structure the second section of the clip body rotates outward and the first section rotates inward towards the center of the wafer support structure. The wafer contact surface may be any of a notch, a latch, a clip, and a pin.

There may also be a wafer retention system for supercritical processing of wafers consisting of a plurality of wafer retention clips disposed along the periphery on a wafer support structure, each retention clip consisting of a spring clip support structure, a spring clip attached to the spring clip support structure, the spring clip configured with a radially inward facing wafer edge detent and an outwardly directed angular terminal end, and oriented for radially outward extension by application of sufficient vertical pressure on the angular terminal end and compressive gripping of a wafer edge of a wafer aligned with its wafer edge detent.

The wafer support structure may have fluid agitation structure incorporated into it as elsewhere described herein as impellers and the like.

The foregoing description of the embodiments of the invention has been presented for the purposes of illustration and description. It is not intended to be exhaustive or to limit the invention to the precise form disclosed. Many additional combinations, modifications and variations of the embodiments explained and illustrated are within the scope of the invention and the claims that follow, as will be apparent from this disclosure.

We claim:

1. A system for supercritical phase fluid processing, comprising:
   a supercritical phase process chamber with an exhaust port;
   at least one fluid isolated and operated rotary device inside said process chamber, said rotary device comprising a base component and a fluid isolated and fluid driven rotable component, said base component comprising isolation fluid flow ports directed towards said rotable component and connectable to an external source of process fluid; and
   a fluid flow control circuit for maintaining an isolation fluid pressure at said fluid flow ports of said base component at higher pressure than the nominal fluid pressure within said process chamber.

2. The system for supercritical phase fluid processing according to claim 1, said rotable component configured with holding clips for securing at least one workpiece.

3. The system for supercritical phase fluid processing according to claim 1, said rotable component comprising at least one impeller.

4. The system for supercritical phase fluid processing according to claim 1, said base component comprising a fluid flow part for applying rotational torque with fluid flow to said rotable component.

5. The system for supercritical phase fluid processing according to claim 4, said fluid flow port for applying rotational torque to said rotable component comprising a fluid flow port for applying a clockwise rotation force, and a fluid flow port for applying a counterclockwise rotation force.

6. The system for supercritical phase fluid processing according to claim 1, said rotary device configured with a home position locator for stopping said rotating component at a pre-determined rotation angle with respect to said base component.

7. The system for supercritical phase fluid processing according to claim 4, said rotary device further comprising a speed of rotation indicator.

8. The system for supercritical phase fluid processing according to claim 4, said rotary device further comprising a direction of rotation indicator.

9. The system for supercritical phase fluid processing according to claim 4, said system further comprising a speed and direction of rotation controller.

10. The system for supercritical phase fluid processing according to claim 4, said rotary component further comprising turbine blades, said fluid flow port in said base component comprising turbine fluid flow ports directed towards said turbine blades, said turbine fluid flow ports communicating with said source of process fluid for applying torque.

11. The system for supercritical phase fluid processing according to claim 10, said turbine blades further comprising a first set of turbine blades oriented for applying clockwise torque to said rotating component and a second set of turbine blades oriented for applying counterclockwise torque to said rotating component.

12. The system for supercritical phase fluid processing according to claim 10, said turbine fluid flow ports on said base component comprising a first set of turbine fluid flow ports oriented for directing fluid flow against said first set of turbine blades and a second set of turbine fluid flow ports oriented for directing fluid flow against said second set of turbine blades, said system further comprising means for switching fluid flow between said first set and said second set of said turbine fluid flow ports.

13. The system for supercritical phase fluid processing according to claim 1, said at least one fluid operated rotary device comprising lower and upper fluid operated rotary devices, between which a workpiece is positionable for processing.

14. A system for supercritical phase fluid processing according to claim 1, said system further comprising a workpiece cassette being configured to hold at least one of a workpiece and an impeller, and being mountable on said rotable component.

15. The system for supercritical phase fluid processing according to claim 14, said workpiece cassette configured with at least one workpiece slot with open slot ends for receiving at least one of a said workpiece and a said impeller, said slot ends configured with workpiece retention clips operable by centrifugal force for closure for securing said workpiece therein.

16. The system for supercritical phase fluid processing according to claim 1, said base component comprising a fluid flow port for centering said rotable component with respect to said base component.

17. The system for supercritical phase fluid processing according to claim 1, said at least one fluid operated rotary device comprising at least two fluid operated rotary devices.

* * * * *